United States Patent
Misaki

(10) Patent No.: US 9,379,143 B2
(45) Date of Patent: Jun. 28, 2016

(54) ACTIVE MATRIX SUBSTRATE, DISPLAY DEVICE, AND ACTIVE MATRIX SUBSTRATE MANUFACTURING METHOD

(75) Inventor: Katsunori Misaki, Yonago (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 43 days.

(21) Appl. No.: 14/008,183

(22) PCT Filed: Mar. 22, 2012

(86) PCT No.: PCT/JP2012/057325
§ 371 (c)(1),
(2), (4) Date: Sep. 27, 2013

(87) PCT Pub. No.: WO2012/133103
PCT Pub. Date: Oct. 4, 2012

(65) Prior Publication Data
US 2014/0042439 A1    Feb. 13, 2014

(30) Foreign Application Priority Data
Mar. 30, 2011  (JP) ................................ 2011-074033

(51) Int. Cl.
| H01L 29/04 | (2006.01) |
| H01L 29/10 | (2006.01) |
| H01L 27/12 | (2006.01) |
| H01L 29/786 | (2006.01) |
| H01L 27/32 | (2006.01) |
| G02F 1/1362 | (2006.01) |
| G02F 1/1345 | (2006.01) |
| G02F 1/1333 | (2006.01) |

(52) U.S. Cl.
CPC ........ *H01L 27/1248* (2013.01); *H01L 27/1225* (2013.01); *H01L 27/1296* (2013.01); *H01L 27/3258* (2013.01); *H01L 27/3262* (2013.01); *H01L 29/78606* (2013.01); *G02F 1/13458* (2013.01); *G02F 1/136213* (2013.01); *G02F2001/13629* (2013.01); *G02F 2001/133337* (2013.01); *G02F 2001/136295* (2013.01); *G02F 2201/501* (2013.01)

(58) Field of Classification Search
CPC .............. H01L 27/124; H01L 27/1225; H01L 27/1214
See application file for complete search history.

(56) References Cited

U.S. PATENT DOCUMENTS

| 6,399,470 | B1 * | 6/2002 | Fujimoto | .......... H01L 21/76802 257/E21.577 |
| 7,371,621 | B2 * | 5/2008 | Kim | ...................... H01L 27/124 257/E21.414 |
| 2003/0184687 | A1 * | 10/2003 | Matsubara | .......... G02F 1/13458 349/43 |
| 2009/0101895 | A1 * | 4/2009 | Kawamura | .......... H01L 27/1225 257/43 |
| 2010/0224872 | A1 * | 9/2010 | Kimura | ............... H01L 27/1214 257/43 |

FOREIGN PATENT DOCUMENTS

| EP | 2 278 618 A1 | 1/2011 |
| JP | 2007-73561 A | 3/2007 |
| JP | 2008-60419 A | 3/2008 |

OTHER PUBLICATIONS

English translation of Official Communication issued in corresponding International Application PCT/JP2012/057325, mailed on Oct. 10, 2013.
Official Communication issued in International Patent Application No. PCT/JP2012/057325, mailed on May 29, 2012.

* cited by examiner

*Primary Examiner* — Jesse Y Miyoshi
(74) *Attorney, Agent, or Firm* — Keating & Bennett, LLP

(57) ABSTRACT

An active matrix substrate (1) includes a source electrode (32), a drain electrode (33), and a semiconductor layer (31) of oxide semiconductor. A gate insulating layer (42) of silicon oxide is formed on the gate electrode (12a); a source electrode (32), a drain electrode (33), and a semiconductor layer (31) are formed on the gate insulating layer (42); a first protection layer (44) of silicon nitride is formed on the gate insulating layer (42) without covering the semiconductor layer (31); and a second protection layer (46) of silicon oxide is formed on the semiconductor layer (31). The first protection layer (44) covers the signal line (14) and the source connection line (36).

8 Claims, 23 Drawing Sheets

FIG.5
(a)
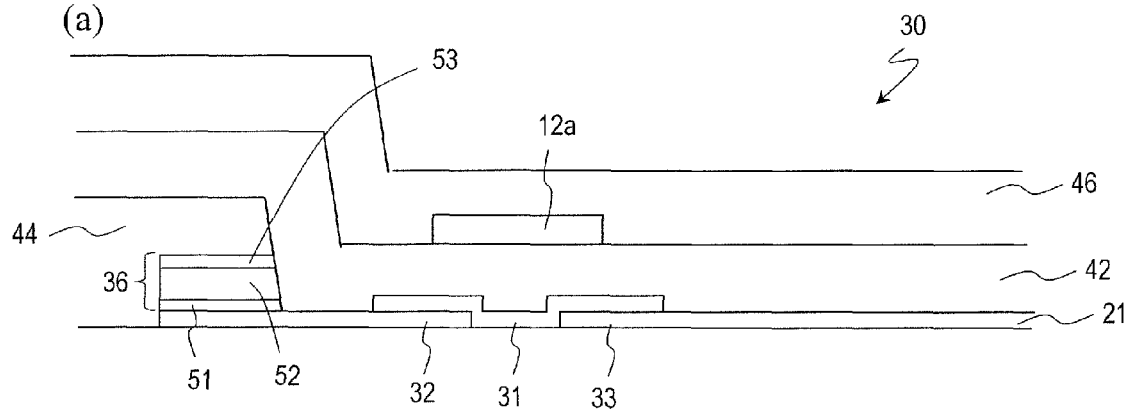
(b)
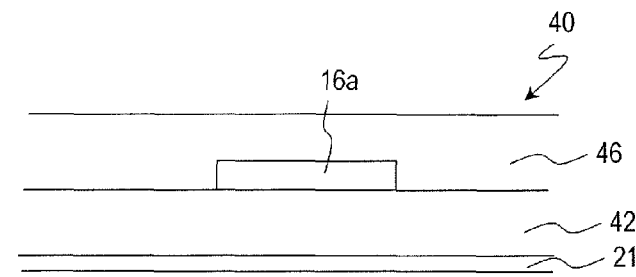
(c)
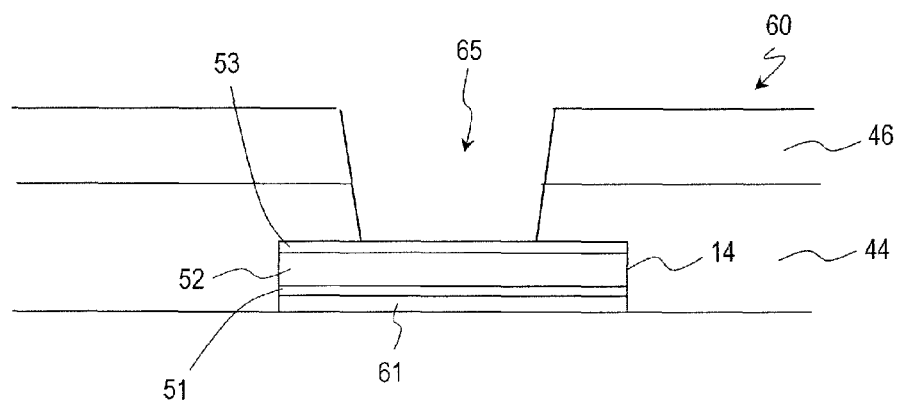
(d)
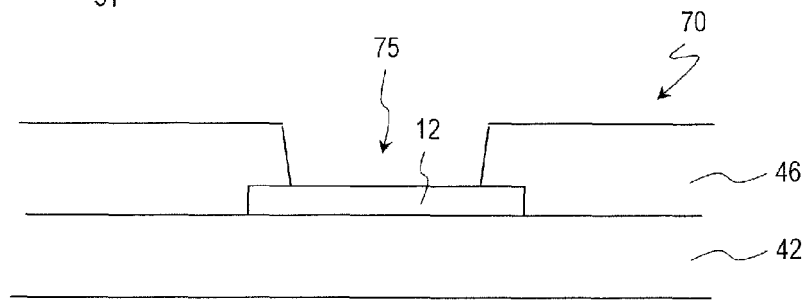

FIG.23
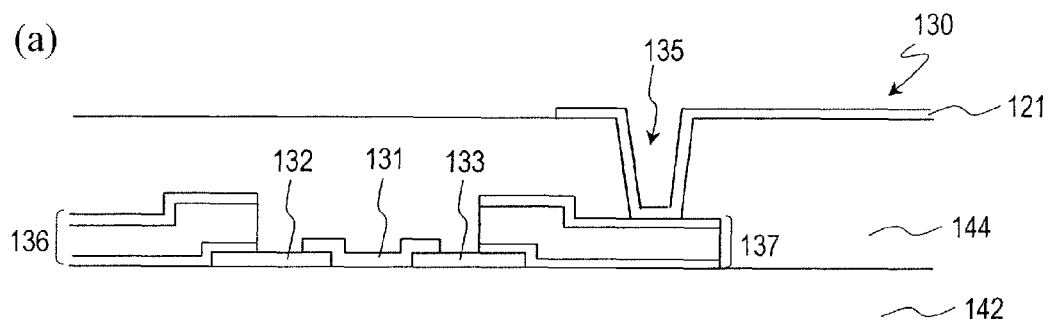
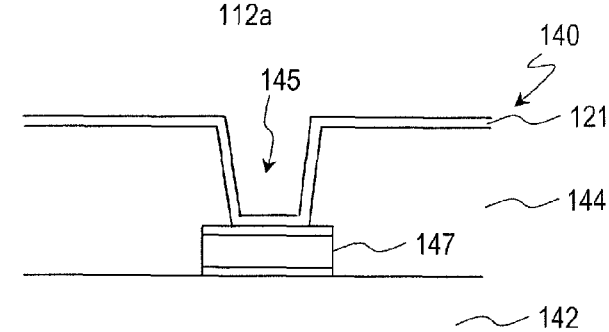
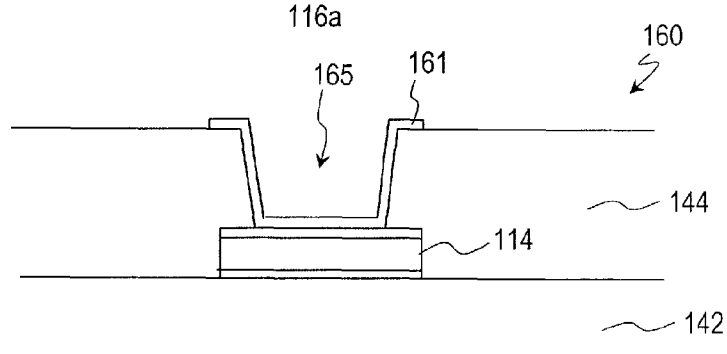
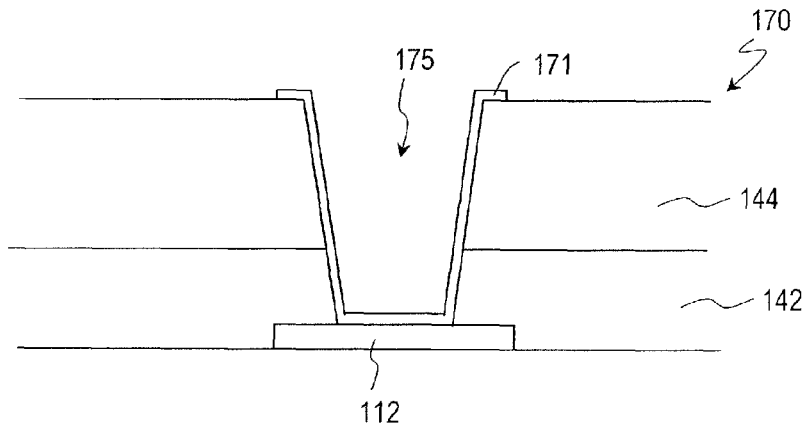

US 9,379,143 B2

ACTIVE MATRIX SUBSTRATE, DISPLAY DEVICE, AND ACTIVE MATRIX SUBSTRATE MANUFACTURING METHOD

TECHNICAL FIELD

The present invention relates to an active matrix substrate having a thin film transistor, and a display device having such an active matrix substrate.

BACKGROUND ART

Generally speaking, a liquid crystal display device or an organic EL (Electro Luminescence) display device of an active matrix type includes: a substrate on which a thin film transistor (Thin Film Transistor; hereinafter also referred to as "TFT") is formed as a switching element for each pixel (also referred to as "TFT substrate"); a counter substrate on which a counter electrode, color filters, and the like are formed; and an optical modulation layer, e.g., a liquid crystal layer, provided between the TFT substrate and the counter substrate.

In the recent years, it has been proposed to use an oxide semiconductor film such as IGZO (InGaZnO$_X$) as a TFT semiconductor layer, instead of a silicon semiconductor film such as amorphous silicon. Such a TFT is referred to as an "oxide semiconductor TFT". An oxide semiconductor has higher mobility than does amorphous silicon. Therefore, an oxide semiconductor TFT is able to operate more rapidly than an amorphous silicon TFT. Moreover, an oxide semiconductor film can be formed through simpler processes than those of a polycrystalline silicon film, and therefore permits easy application to devices which require a large area.

Patent Documents 1 and 2 describe examples of oxide semiconductor TFTs.

The oxide semiconductor TFT of Patent Document 1 is an oxide TFT including a semiconductor layer whose main component is zinc oxide. According to Patent Document 1, its production method includes a step of forming on a substrate a thin-film oxide semiconductor layer whose main component is zinc oxide, a step of forming a first insulating film on the thin-film oxide semiconductor layer, and a step of forming a second insulating film on the first insulating film, such that the first insulating film is oxidized before forming the second insulating layer.

The oxide semiconductor TFT of Patent Document 2 includes a thin-film oxide semiconductor layer whose main component is zinc oxide (ZnO) and which is disposed between a source electrode and a drain electrode, and a gate insulating film composed of a silicon-type insulating film which covers the upper face and side faces of the thin-film oxide semiconductor layer, such that the gate insulating film includes a first gate insulating film which covers the upper face of the thin-film oxide semiconductor layer and a second gate insulating film which covers the front face of the first gate insulating film and the side faces of the thin-film oxide semiconductor layer.

CITATION LIST

Patent Literature

[Patent Document 1] Japanese Laid-Open Patent Publication No. 2008-60419
[Patent Document 2] Japanese Laid-Open Patent Publication No. 2007-73561

SUMMARY OF INVENTION

Technical Problem

With reference to FIGS. 19 to 24, an active matrix substrate 100 according to a first reference example will be described.

FIG. 19 is a plan view showing the construction of a pixel 120, a signal line terminal (also referred to "S terminal") 160, a gate line terminal (also referred to "G terminal") 170, and a storage capacitor line terminal (also referred to "Cs terminal") 180 of an active matrix substrate 100.

The active matrix substrate 100 includes a plurality of pixels 120 provided in a matrix shape, a plurality of scanning lines 112 and a plurality of signal lines 114 extending so as to be orthogonal to one another, and a plurality of storage capacitor lines (also referred to "Cs lines") 116 which extend in parallel to the plurality of scanning lines 112.

As shown in FIG. 19, each pixel 120 includes a pixel electrode 121 and a storage capacitor portion 140. Near an intersection between the scanning line 112 and the signal line 114, a TFT 130 corresponding to the pixel 120 is disposed. An S terminal 160, a G terminal 170, and a Cs terminal 180 are disposed at ends of the signal line 114, the scanning line 112, and the Cs line 116, respectively.

FIGS. 20(a) to (d) are cross-sectional views showing the construction of the TFT 130, the storage capacitor portion 140, the S terminal 160, and the G terminal 170, respectively, and show an A-A' cross section, a B-B' cross section, a C-C' cross section, and D-D' cross section in FIG. 19, respectively.

As shown in FIG. 19 and FIG. 20(a), the TFT 130 includes a semiconductor layer 131, a source electrode 132, a drain electrode 133, and a gate electrode 112a. The semiconductor layer 131 is an oxide semiconductor layer of IGZO or the like. The gate electrode 112a is a portion of the scanning line 112. A gate insulating layer 142 is formed on the gate electrode 112a, such that the source electrode 132, the drain electrode 133, and the semiconductor layer 131 are formed upon the gate insulating layer 142. The semiconductor layer 131 is formed so as to cover a portion of each of the source electrode 132 and the drain electrode 133. Moreover, a source connection line 136 which interconnects the source electrode 132 and the signal line 114 and a drain connection line 137 which interconnects the drain electrode 133 and the pixel electrode 121 are formed upon the gate insulating layer 142.

On the semiconductor layer 131, the source electrode 132, the drain electrode 133, the source connection line 136, and the drain connection line 137, a first protection layer 144 of silicon oxide (SiO$_2$) and a second protection layer 146 of silicon nitride (SiN) are stacked in this order. The drain connection line 137 is connected to the pixel electrode 121 via a contact hole 135 which is formed so as to penetrate through the first protection layer 144 and the second protection layer 146. The source connection line 136 and the drain connection line 137 have a three-layer structure including a lower layer 151, an intermediate layer 152, and an upper layer 153. The lower layer 151, the intermediate layer 152, and the upper layer 153 are made of Ti (titanium), Al (aluminum), and MoN (molybdenum nitride), respectively, for example.

As shown in FIG. 19 and FIG. 20(b), the storage capacitor portion 140 is composed of a storage capacitor electrode 116a, the gate insulating layer 142 formed on the storage capacitor electrode 116a, a Cs counter electrode (storage capacitor counter electrode) 147 formed on the gate insulating layer 142, the first protection layer 144 formed on the Cs counter electrode 147, the second protection layer 146 stacked on the first protection layer 144, and the pixel electrode 121 formed on the second protection layer 146.

The Cs counter electrode 147 is connected to the pixel electrode 121 via a contact hole 145 which is formed so as to penetrate through the first protection layer 144 and the second protection layer 146. The storage capacitor electrode 116a is a portion of the Cs line 116. A storage capacitor is formed by the storage capacitor electrode 116a, the Cs counter electrode 147, and the portion of the gate insulating layer 142 that is interposed between both electrodes. Note that, similarly to the source connection line 136 and the drain connection line 137, the Cs counter electrode 147 has a three-layer structure including a lower layer 151, an intermediate layer 152, and an upper layer 153.

As shown in FIG. 19 and FIG. 20(c), the S terminal 160 is composed of the gate insulating layer 142, the signal line 114 disposed on the gate insulating layer 142, the first protection layer 144 stacked on the signal line 114, the second protection layer 146 stacked on the first protection layer 144, and the upper connection line 161 formed on the second protection layer 146. The signal line 114 is connected to the upper connection line 161 via a contact hole 165 which is formed so as to penetrate through the first protection layer 144 and the second protection layer 146. Similarly to the source connection line 136, the signal line 114 has a three-layer structure including a lower layer 151, an intermediate layer 152, and an upper layer 153.

As shown in FIG. 19 and FIG. 20(d), the G terminal 170 is composed of the scanning line 112 as well as the gate insulating layer 142, the first protection layer 144, the second protection layer 146, and the upper connection line 171, which are sequentially formed on the scanning line 112. The scanning line 112 is connected to the upper connection line 171 via a contact hole 175 which is formed so as to penetrate through the gate insulating layer 142, the first protection layer 144, and the second protection layer 146.

Next, with reference to FIGS. 21(a) to (d) and FIGS. 22(e) to (g), a method of producing the active matrix substrate 100 will be described. FIGS. 21(a) to (d) and FIGS. 22(e) to (g) show the construction of an A-A' cross section of the TFT 130, a B-B' cross section of the storage capacitor portion 140, a C-C' cross section of the S terminal 160, and a D-D' cross section of the G terminal 170 in FIG. 19.

Step (A):

First, a metal layer is formed on a substrate by a sputtering technique or the like. This metal layer has a three-layer construction of Al, Ti, and TiN (titanium nitride), for example. Next, the metal layer is patterned by a known photolithography technique (first masking step) to obtain, as shown in FIG. 21(a), a gate electrode 112a, a storage capacitor electrode 116a, and a scanning line 112. At this time, a Cs line 116 not shown herein is also formed concurrently. No metal layer is left on the S terminal 160.

Step (B):

Next, as shown in FIG. 21(b), silicon oxide is stacked on the substrate by a plasma CVD technique so as to cover the gate electrode 112a, the storage capacitor electrode 116a, and the scanning line 112, thereby obtaining a gate insulating layer 142.

Step (C):

Next, a transparent electrically conductive material of ITO (Indium Tin Oxide) or the like is stacked on the gate insulating layer 142, and patterned by a photolithography technique (second masking step), thereby obtaining a source electrode 132 and a drain electrode 133 as shown in FIG. 21(c).

Step (D):

Next, an oxide semiconductor material such a IGZO is stacked on the gate insulating layer 142 by a sputtering technique, so as to cover the source electrode 132 and the drain electrode 133. Thereafter, the oxide semiconductor material is patterned by a photolithography technique (third masking step), thereby obtaining a semiconductor layer 131 as shown in FIG. 21(d).

Step (E):

Next, by a sputtering technique, Ti, Al, and MoN are stacked in this order on the gate insulating layer 142, so as to cover the source electrode 132, the drain electrode 133, and the semiconductor layer 131. Thereafter, these three layers are simultaneously patterned by a photolithography technique (fourth masking step), thereby obtaining a source connection line 136, a drain connection line 137, a Cs counter electrode 147, and a signal line 114 as shown in FIG. 22(e). These lines have a three-layer construction as mentioned above.

Step (F):

Next, silicon oxide is stacked so as to cover each line to form a first protection layer 144, and silicon nitride is stacked thereupon to obtain a second protection layer 146. Thereafter, by a photolithography technique, contact holes 135, 145, 165, and 175 are formed above the drain connection line 137, the Cs counter electrode 147, the signal line 114 at the S terminal 160, and the scanning line 112 at the G terminal 170, respectively (fifth masking step). Herein, the upper layers 153 of the drain connection line 137, the Cs counter electrode 147, and the signal line 114 serve as an etch stopper, and etching occurs so that the upper layers 153 of the drain connection line 137, the Cs counter electrode 147, and the signal line 114 are exposed within the contact holes 135, 145, and 165, respectively. Moreover, at the G terminal 170, the scanning line 112 is exposed within the contact hole 175.

Step (G):

Next, a transparent electrically conductive material such as ITO is stacked on the second protection layer 146 by a sputtering technique. At this time, the transparent electrically conductive material is also stacked in the contact holes 135, 145, 165, and 175. Thereafter, the transparent electrode material is patterned by a photolithography technique to form a pixel electrode 121, an upper connection line 161, and an upper connection line 171 (sixth masking step).

Thus, the active matrix substrate 100 shown in FIG. 19 and FIG. 20 is accomplished.

Next, an active matrix substrate 100 according to a second reference example will be described. The active matrix substrate 100 of the second reference example is basically identical in construction to the active matrix substrate 100 of the first reference example, except that the second protection layer 146 is not included. Therefore, like constituent elements will be denoted by like reference numerals, and the description thereof will be omitted.

The active matrix substrate 100 of the second reference example has the same planar construction as that shown in FIG. 19, and the description thereof will be omitted.

FIGS. 23(a) to (d) are cross-sectional views showing the construction of the TFT 130, the storage capacitor portion 140, the S terminal 160, and the G terminal 170 of the active matrix substrate 100 of the second reference example, respectively, and show an A-A' cross section, a B-B' cross section, a C-C' cross section, and D-D' cross section in FIG. 19, respectively.

As shown in FIG. 23(a), at the TFT 130, a pixel electrode 121 is formed on a first protection layer 144 of silicon oxide, and a drain connection line 137 is connected to the pixel electrode 121 via a contact hole 135 which penetrates through the first protection layer 144.

As shown in FIG. 23(b), at the storage capacitor portion 140, the pixel electrode 121 is formed on the first protection layer 144, and a Cs counter electrode 147 is connected to the pixel electrode 121 via a contact hole 135 which penetrates through the first protection layer 144.

As shown in FIG. 23(c), at the S terminal 160, a signal line 114 is connected to an upper connection line 161 via a contact hole 165 which penetrates through the first protection layer 144.

As shown in FIG. 23(d), at the G terminal 170, a scanning line 112 is connected to an upper connection line 171 via contact hole 175 which penetrates through the gate insulating layer 142 and the first protection layer 144.

Next, with reference to FIGS. 24(a) and (b), a method of producing the active matrix substrate 100 of the second reference example will be described. FIGS. 24(a) and (b) show the construction of an A-A' cross section of the TFT 130, a B-B' cross section of the storage capacitor portion 140, a C-C' cross section of the S terminal 160, and a D-D' cross section of the G terminal 170 in FIG. 19.

First, through steps (A) to (D) which have been shown with reference to FIGS. 21(a) to (d), a layered structure as shown in FIG. 22(e) is obtained. Next, silicon oxide is stacked on this layered structure to form a first protection layer 144. Thereafter, the first protection layer 144 is patterned by a photolithography technique to form contact holes 135, 145, 165, and 175 above the drain connection line 137, the Cs counter electrode 147, the signal line 114 at the S terminal 160, and the scanning line 112 at the G terminal 170, respectively (fifth masking step). Etching occurs so that the upper layer 153 of the drain connection line 137, the Cs counter electrode 147, and the signal line 114 is exposed within the contact holes 135, 145, and 165, respectively. Moreover, at the G terminal 170, the scanning line 112 is exposed within the contact hole 175.

Next, a transparent electrically conductive material is stacked on the first protection layer 144 by a sputtering technique. At this time, the transparent electrically conductive material is also stacked in the contact holes 135, 145, 165, and 175. Thereafter, the transparent electrode material is patterned by a photolithography technique to form a pixel electrode 121, an upper connection line 161, and an upper connection line 171 (sixth masking step).

In the production steps of an active matrix substrate having an oxide semiconductor, after forming the oxide semiconductor layer and the protection layers thereon, an annealing treatment is conducted at a high temperature of about 300 to 350° C. However, in the case where silicon oxide and silicon nitride are used for the protection layers on the semiconductor layer as in the first reference example above, or where only silicon nitride is used for the protection layer, a reduction reaction occurs in the semiconductor layer at the time of annealing because of hydrogen being contained in the silicon nitride, thus possibly causing a problematic deterioration of the TFT characteristics. Specifically, the deterioration of TFT characteristics may involve increase in the leak currents from the source electrode and the drain electrode, lowering of the TFT threshold, and so on.

In order to prevent this problem, it might be possible to use silicon oxide alone for the protection layer, as in the second reference example. However, this is prone to problems in that silicon oxide does not provide good dampproofness and may allow the underlying source connection line, drain connection line, signal line, Cs counter electrode, and the like to be corroded.

Furthermore, when producing the active matrix substrates 100 of the first reference example and the second reference example, six photolithography steps (six masking steps) are required, thus resulting in the problems of poor production efficiency and high production cost.

The present invention has been made in view of the above, and an objective thereof is to provide an active matrix substrate having an oxide semiconductor TFT with high TFT characteristics. Another objective of the present invention is to provide an active matrix substrate which has excellent TFT characteristics, and which excels in terms of durability of the source connection line, the drain connection line, the signal line, and the like. Another objective of the present invention is to provide such an active matrix substrate with a good production efficiency. Another objective of the present invention is to provide a display device, e.g., a liquid crystal display device or an organic EL display device, or an electronic device having such an active matrix substrate.

Solution to Problem

An active matrix substrate according to the present invention is an active matrix substrate including a thin film transistor, the thin film transistor having an oxide semiconductor, comprising: a gate electrode, a source electrode, and a drain electrode of the thin film transistor; a signal line for supplying a voltage to the source electrode; a scanning line for supplying a switching signal for the thin film transistor; and a semiconductor layer connected to the source electrode and the drain electrode, the semiconductor layer being made of an oxide semiconductor, wherein, (A) a gate insulating layer of silicon oxide is formed on the gate electrode, the source electrode, the drain electrode, and the semiconductor layer being formed on the gate insulating layer, a first protection layer of silicon nitride being formed on the gate insulating layer without covering the semiconductor layer, and a second protection layer of silicon oxide being formed on the semiconductor layer; or (B) a first protection layer of silicon nitride is formed without covering the semiconductor layer, a gate insulating layer of silicon oxide being formed on the semiconductor layer, the gate electrode being formed on the gate insulating layer above a channel portion of the semiconductor layer, and a second protection layer of silicon nitride being formed on the gate electrode.

In one embodiment, the active matrix substrate comprises a source connection line for interconnecting the signal line and the source electrode, wherein the signal line and the source connection line are formed so as to be in contact with the first protection layer.

In one embodiment, the signal line is formed on an electrode layer of a transparent electrode material; the source electrode is made of the transparent electrode material; and the source connection line is formed on a portion of the source electrode.

In one embodiment, the active matrix substrate has a plurality of pixels each including a pixel electrode, wherein the source electrode, the drain electrode, and the pixel electrode are made in a same layer and of a same transparent electrode material.

In one embodiment, the active matrix substrate comprises a storage capacitor formed in each of the plurality of pixels, wherein a storage capacitor electrode of the storage capacitor is disposed so as to oppose the pixel electrode with the gate insulating layer interposed therebetween.

In one embodiment, the active matrix substrate comprises a signal line terminal, the signal line terminal including a portion of the signal line, wherein a contact hole penetrating through the first protection layer and the second protection layer and reaching the signal line is formed in the signal line terminal.

In one embodiment, the active matrix substrate comprises a gate line terminal, the gate line terminal including a portion of the scanning line, wherein a contact hole penetrating at least through the second protection layer and reaching the scanning line is formed in the gate line terminal.

A display device according to the present invention is a display device comprising the above active matrix substrate.

A method of producing an active matrix substrate according to the present invention is a method of producing an active matrix substrate including a thin film transistor, the thin film transistor having an oxide semiconductor, comprising: a step of forming an electrode layer to become a source electrode and a drain electrode of the thin film transistor; a step of stacking a metal layer on the electrode layer; a step of forming a first protection layer of silicon nitride on the metal layer; a step of patterning the first protection layer and the metal layer to expose a portion of the electrode layer; a step of forming a semiconductor layer of oxide semiconductor on the electrode layer; and a step of forming a second protection layer or gate insulating layer on the exposed electrode layer, the semiconductor layer, and the remaining first protection layer; the second protection layer or gate insulating layer being of silicon oxide.

In one embodiment, a second protection layer of silicon oxide is formed on the exposed electrode layer, the semiconductor layer, and the remaining first protection layer; and before forming the electrode layer, a step of forming a gate electrode of the thin film transistor and a step of forming a gate insulating layer on the gate electrode are conducted.

In one embodiment, a gate insulating layer of silicon oxide is formed on the exposed electrode layer, the semiconductor layer, and the remaining first protection layer; and after forming the gate insulating layer, a step of forming a gate electrode of the thin film transistor on the gate insulating layer above the semiconductor layer and a step of forming a second protection layer of silicon nitride on the gate electrode are conducted.

In one embodiment, the metal layer forms a signal line for supplying a voltage to the source electrode and a source connection line for interconnecting the signal line and the source electrode.

In one embodiment, the electrode layer is made of a transparent electrode material, and a pixel electrode is formed from the electrode layer.

Advantageous Effects of Invention

According to the present invention, a silicon oxide layer is formed on an oxide semiconductor layer without a silicon nitride layer being formed, or a silicon oxide layer is formed on an oxide semiconductor layer, and a silicon nitride layer is formed thereupon via a gate electrode. As a result, an active matrix substrate having an oxide semiconductor TFT with excellent TFT characteristics can be provided.

According to the present invention, a silicon oxide layer is formed on the oxide semiconductor layer, and a silicon nitride layer is formed on lines such as signal lines, and source connection lines. As a result, an active matrix substrate which excels in terms of line anticorrosiveness and TFT characteristics can be provided.

According to the present invention, the active matrix substrate can be formed through fewer masking steps, so that the active matrix substrate can be provided with a good production efficiency.

According to the present invention, a high-quality display device in which the above active matrix substrate is used can be provided with a good production efficiency.

BRIEF DESCRIPTION OF DRAWINGS

FIG. 5 (a) to (d) are cross-sectional views schematically showing the construction of a TFT 30, a storage capacitor portion 40, a signal line terminal 60, and a gate line terminal 70, respectively, of an active matrix substrate 1 according to Embodiment 2.

FIG. 23 (a) to (d) are cross-sectional views schematically showing the construction of a TFT 130, a storage capacitor portion 140, a signal line terminal 160, and a gate line terminal 170 of the active matrix substrate 100 according to the second reference example.

DESCRIPTION OF EMBODIMENTS

Hereinafter, with reference to the drawings, active matrix substrates according to embodiments of the present invention will be described. However, the scope of the invention is not to be limited to the following embodiments. The active matrix substrate of the present invention is a TFT substrate on which an oxide semiconductor TFT is formed, and broadly encompasses TFT substrates of organic EL display devices, electronic devices, and the like, in addition to TFT substrates of liquid crystal display devices as will be described later.

Embodiment 1

With reference to FIGS. 1 to 4, an active matrix substrate 1 according to Embodiment 1 of the present invention will be described.

Figure 1:
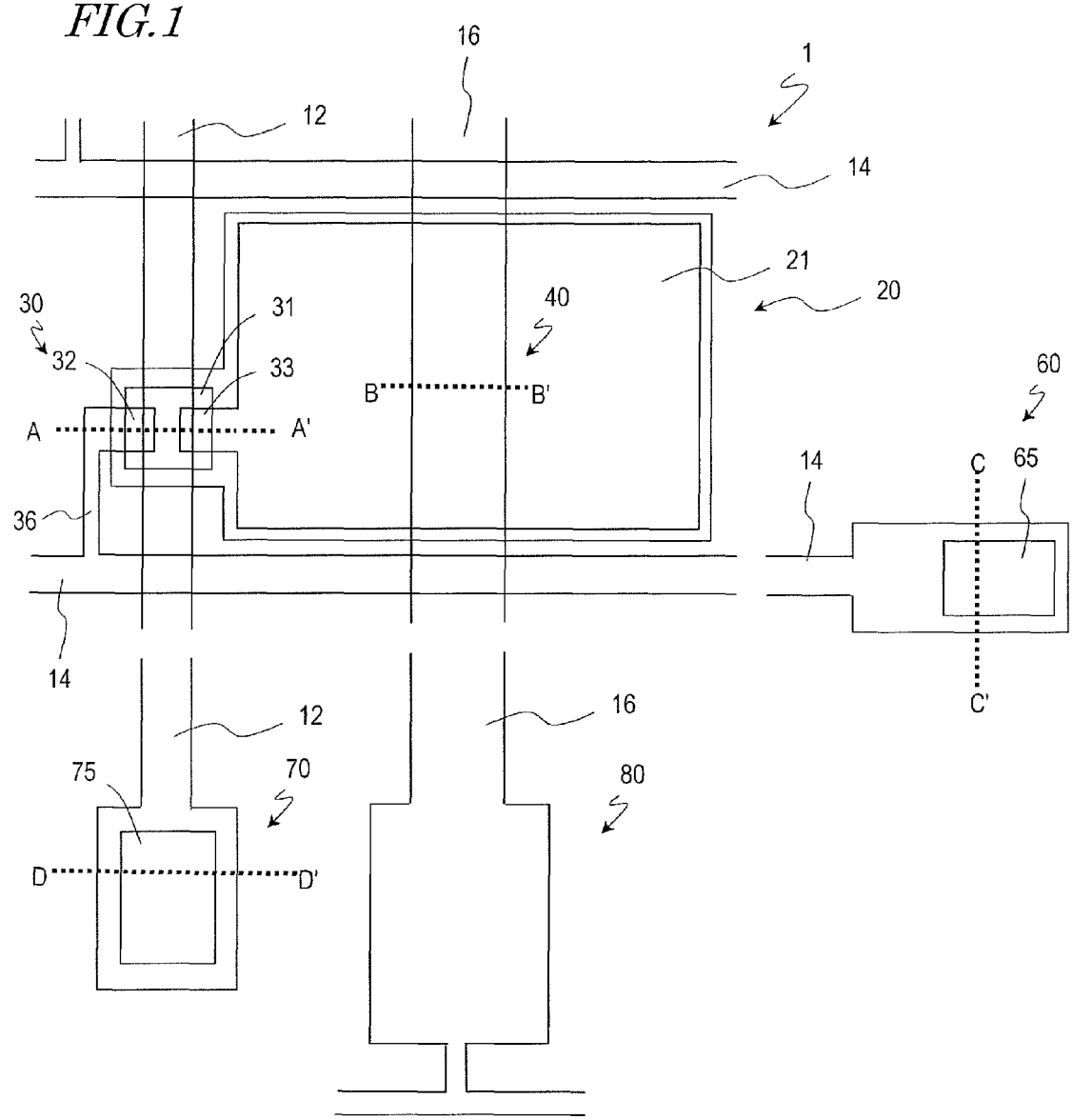
FIG. 1 A plan view schematically showing the construction of an active matrix substrate 1 according to an embodiment of the present invention.

FIG. 1 is a plan view showing the construction of a pixel 20, a signal line terminal (S terminal) 60, a gate line terminal (G terminal) 70, and a storage capacitor line terminal (Cs terminal) 80 of the active matrix substrate 1.

The active matrix substrate 1 includes: a plurality of pixels 20 provided in a matrix shape; a plurality of scanning lines 12 and a plurality of signal lines 14 extending so as to be orthogonal to one another; and a plurality of storage capacitor lines (Cs lines) 16 which extend in parallel to the plurality of scanning lines 12.

As shown in FIG. 1, each pixel 20 includes a pixel electrode 21 and a storage capacitor portion 40. Near an intersection between the scanning line 12 and the signal line 14, a TFT 30 corresponding to the pixel 20 is disposed. A switching signal for the TFT 30 is supplied by the scanning line 12, and a display signal is supplied to the source electrode 32 by the signal line 14, via a source connection line 36 of the TFT 30. An S terminal 60, a G terminal 70, and a Cs terminal 80 are disposed at ends of the signal line 14, the scanning line 12, and the Cs line 16, respectively.

FIGS. 2(a) to (d) are cross-sectional views showing the construction of the TFT 30, the storage capacitor portion 40, the S terminal 60, and the G terminal 70, respectively, and show an A-A' cross section, a B-B' cross section, a C-C' cross section, and D-D' cross section in FIG. 1, respectively.

As shown in FIG. 1 and FIG. 2(a), the TFT 30 includes a semiconductor layer 31, a source electrode 32, a drain electrode 33, and a gate electrode 12a. The semiconductor layer 31 is an oxide semiconductor layer of IGZO or the like. The gate electrode 12a is a portion of the scanning line 12. The gate electrode 12a and the scanning line 12 have a four-layer structure of Al, Ti, TiN, and ITO that are sequentially stacked, for example.

On the gate electrode 12a, a gate insulating layer 42 of silicon oxide is formed, such that the source electrode 32, the drain electrode 33, the semiconductor layer 31, and the pixel electrode 21 are formed on the gate insulating layer 42. The semiconductor layer 31 is formed so as to cover a portion of each of the source electrode 32 and the drain electrode 33, with a channel layer of the TFT 30 being formed between both electrodes.

Moreover, a source connection line 36 which interconnects the source electrode 32 and the signal line 14 is formed upon the gate insulating layer 42. The source connection line 36 is formed at the opposite end of the source electrode 32 from the semiconductor layer 31. The source connection line 36 has a four-layer structure of a first layer 51, a second layer 52, a third layer 53, and a fourth layer 54 that are sequentially stacked. The first layer 51, the second layer 52, the third layer 53, and the fourth layer 54 are made of e.g. MoN, Al, MoN, and ITO, respectively. The source connection line 36 may have a single-layered or multi-layered construction using any such metal(s) or any other metal(s).

The source electrode 32, the drain electrode 33, and the pixel electrode 21 are made of a transparent electrode material such as ITO, and are formed in the same layer. The drain electrode 33 and the pixel electrode 21 are formed as an integral piece on the gate insulating layer 42. The source connection line 36 and the signal line 14 are formed upon the layer of transparent electrode material.

On the gate insulating layer 42, a first protection layer 44 of silicon nitride and a second protection layer 46 of silicon oxide are formed. While the first protection layer 44 covers the source connection line 36, the first protection layer 44 covers neither the semiconductor layer 31, the portion of the source electrode 32 where it does not overlap with the source connection line 36, the drain electrode 33, nor the pixel electrode 21. The second protection layer 46 covers the first protection layer 44, the semiconductor layer 31, the portion of the source electrode 32 where it does not overlap with the source connection line 36, the drain electrode 33, and the pixel electrode 21.

As shown in FIG. 1 and FIG. 2(b), the storage capacitor portion 40 is composed of a storage capacitor electrode 16a, the gate insulating layer 42 formed on the storage capacitor electrode 16a, the pixel electrode 21 formed on the gate insulating layer 42, and the second protection layer 46 formed on the pixel electrode 21. The storage capacitor electrode 16a is a portion of the Cs line 16. A storage capacitor is formed by the storage capacitor electrode 16a, the pixel electrode 21, and the portion of the gate insulating layer 42 that is interposed between both electrodes.

As shown in FIG. 1 and FIG. 2(c), the S terminal 60 includes the gate insulating layer 42, the electrode layer 61 and the signal line 14 disposed on the gate insulating layer 42, the first protection layer 44 stacked so as to cover the signal line 14, and the second protection layer 46 stacked on the first protection layer 44. Above the signal line 14, a contact hole 65 which penetrates through the first protection layer 44 and the second protection layer 46 to reach the signal line 14 is formed. The electrode layer 61 is a transparent electrode layer which is made of the same material and through the same step as the pixel electrode 21. The signal line 14 is formed on the electrode layer 61, and similarly to the source connection line 36 and the like, has a four-layer structure of a first layer 51, a second layer 52, a third layer 53, and a fourth layer 54 that are sequentially stacked. Via the contact hole 65, an upper connection line (not shown) formed on the second protection layer 46 is connected to the signal line 14.

As shown in FIG. 1 and FIG. 2(d), the G terminal 70 is composed of the scanning line 12, and the gate insulating layer 42, the first protection layer 44, and the second protection layer 46 sequentially formed on the scanning line 12. Above the scanning line 12, a contact hole 75 which penetrates through the gate insulating layer 42, the first protection layer 44, and the second protection layer 46 to reach the signal line 12 is formed. Via the contact hole 75, an upper connection line (not shown) formed on the second protection layer 46 is connected to the scanning line 12.

In the present embodiment, a first protection layer 44 of silicon nitride is formed on the gate insulating layer 42 without covering the semiconductor layer 31, and the second protection layer 46 of silicon oxide is formed on the semiconductor layer 31. Therefore, when conducting an annealing treatment at a high temperature after the second protection layer 46 is formed, the problematic deterioration in the characteristics of the TFT 30 due to hydrogen that is contained in the silicon nitride can be prevented. Moreover, since lines such as the signal line 14 and the source connection line 36 are covered by the silicon nitride layer, line corrosion is prevented.

Next, with reference to FIGS. 3(a) to (d) and FIGS. 4(e) to (g), a method of producing the active matrix substrate 1 will be described. FIGS. 3(a) to (d) and FIGS. 4(e) to (g) show the construction of an A-A' cross section of the TFT 30, a B-B' cross section of the storage capacitor portion 40, a C-C' cross section of the S terminal 60, and a D-D' cross section of the G terminal 70 in FIG. 1.

Step A1:
First, a metal layer is formed on a substrate by a sputtering technique or the like. This metal layer has a four-layer structure of Al, Ti, TiN, and ITO, for example. Next, the metal layer is patterned by a known photolithography technique (first masking step) to obtain, as shown in FIG. 3(a), a gate electrode 12a, a storage capacitor electrode 16a, and a scanning line 12. At this time, a Cs line 16 not shown herein is also formed concurrently. No metal layer is left on the S terminal 60.

Step B1:
Next, as shown in FIG. 3(b), silicon oxide is stacked on the substrate by a plasma CVD technique so as to cover the gate electrode 12a, the storage capacitor electrode 16a, and the scanning line 12, thereby obtaining a gate insulating layer 42.

Step C1:
Next, ITO, MoN, Al, MoN, and ITO are stacked in this order on the gate insulating layer 42. Thereafter, the stacked metal layers are patterned by a photolithography technique (second masking step) to obtain a metal multilayer structure 19 and a signal line 14 shown in FIG. 3(c). Above the gate electrode 12a of the TFT 30, an aperture 39 in the metal multilayer structure 19 is formed at a position which later becomes a channel region of the TFT 30.

Step D1:
Next, on the gate insulating layer 42, by a plasma CVD technique, silicon nitride is stacked so as to cover the metal multilayer structure 19 and the signal line 14 to obtain a first protection layer 44 as shown in FIG. 3(d).

Step E1:
Next, the first protection layer 44 is selectively removed by a photolithography technique to expose, as shown in FIG. 4(e), a portion of the source electrode 32, the drain electrode 33, and the pixel electrode 21 (third masking step). At this time, the remaining metal multilayer structure 19 forms the source connection line 36.

Step F1:
Next, an oxide semiconductor material such a IGZO is stacked on the substrate. Thereafter, the oxide semiconductor material is patterned by a photolithography technique (fourth masking step), thereby obtaining a semiconductor layer 31 as shown in FIG. 4(f).

Step G1:
Next, by a plasma CVD technique or the like, silicon oxide is stacked on the pixel electrode 21, the source electrode 32, the drain electrode 33, the semiconductor layer 31, and the remaining first protection layer 44 to obtain the second protection layer 46. Thereafter, the second protection layer 46 is patterned by a photolithography technique to form contact holes 65 and 75, respectively, above the signal line 14 at the S terminal 60 and the scanning line 12 at the G terminal 70 (fifth masking step). Herein, the fourth layer 54 of the signal line 14 serves as an etch stopper, such that the fourth layer 54 is exposed within the contact hole 65. Moreover, at the G terminal 70, the scanning line 12 is exposed within the contact hole 75.

Figure 2:
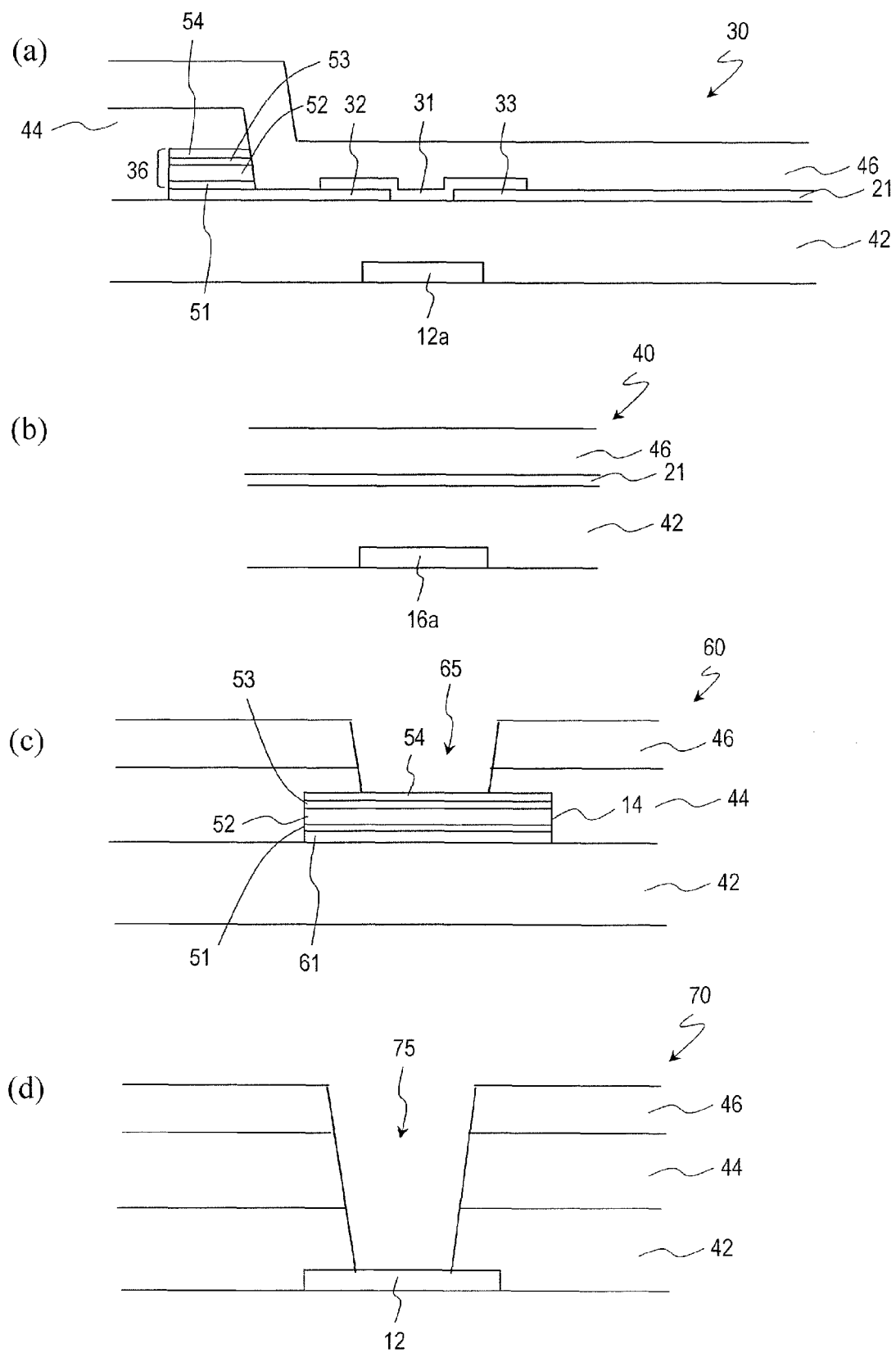
FIG. 2 (a) to (d) are cross-sectional views schematically showing the construction of a TFT 30, a storage capacitor portion 40, a signal line terminal 60, and a gate line terminal 70, respectively, of the active matrix substrate 1 according to Embodiment 1.
Figure 3:
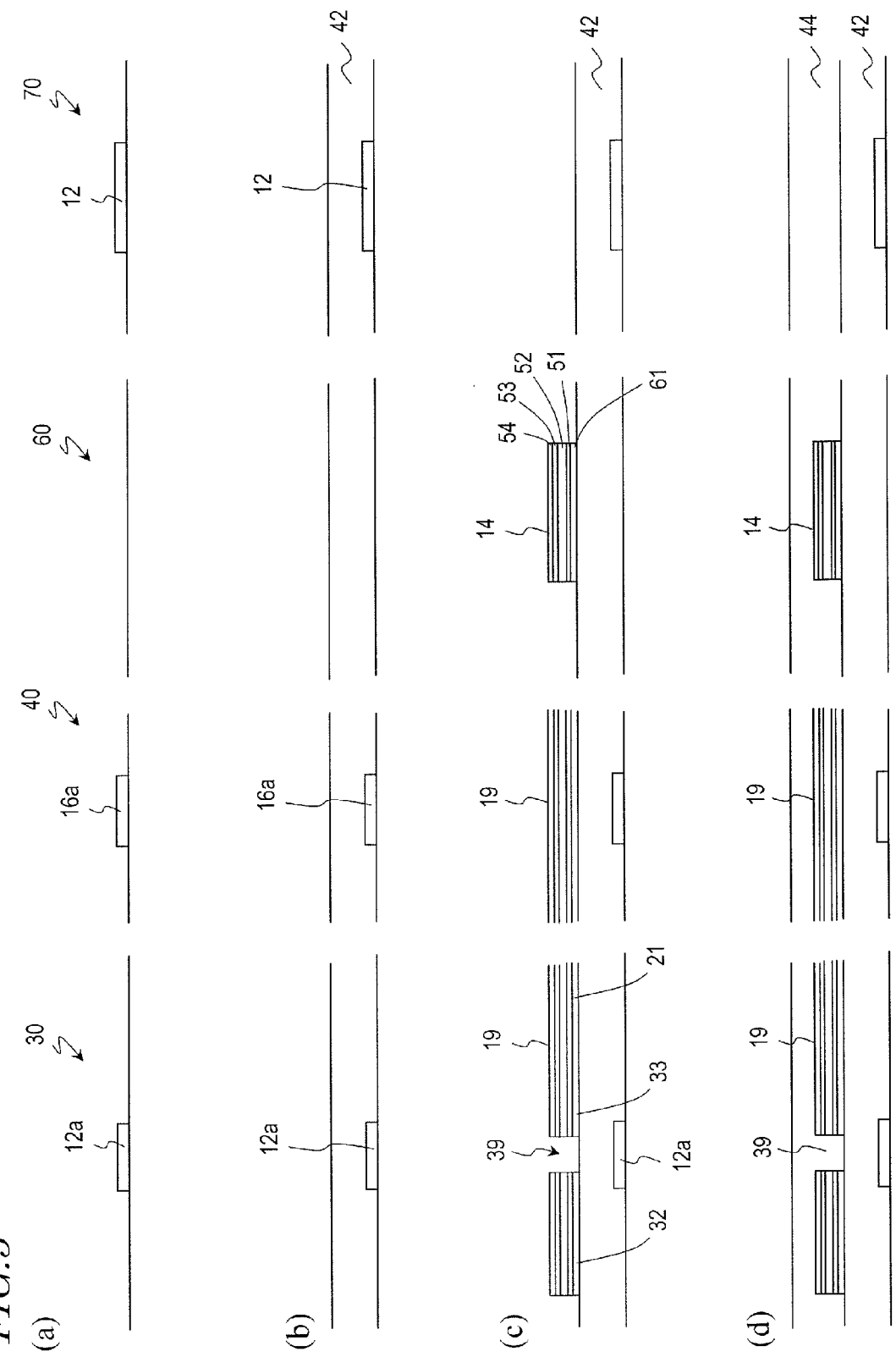
FIG. 3 (a) to (d) are cross-sectional views showing a method of producing the active matrix substrate 1 according to Embodiment 1.
Figure 4:
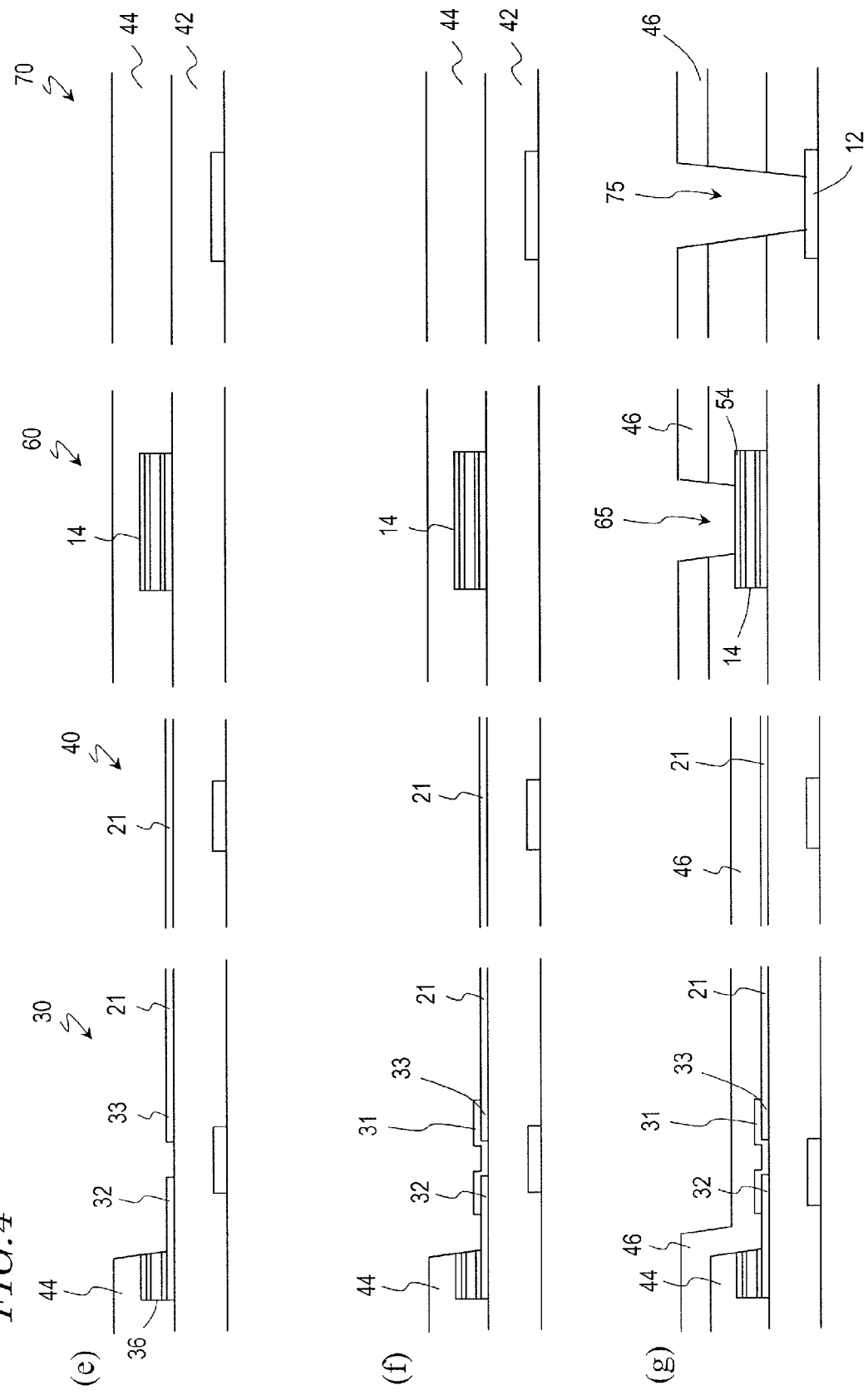
FIG. 4 (e) to (g) are cross-sectional views showing a method of producing the active matrix substrate 1 according to Embodiment 1.

Thus, the active matrix substrate 1 shown in FIG. 1 and FIG. 2 is accomplished. Since only five masking steps are required in the above production steps, improved production efficiency is obtained.

Embodiment 2

Next, an active matrix substrate 1 according to Embodiment 2 of the present invention will be described. Hereinafter, constituent elements which are identical to those of the active matrix substrate 1 of Embodiment 1 will basically be denoted by identical reference numerals, and their description will be omitted; the differences therefrom will mainly be described. The active matrix substrate 1 of Embodiment 2 has the same planar construction as that shown in FIG. 1, and the description thereof will be omitted.

FIGS. 5(a) to (d) are cross-sectional views showing the construction of the TFT 30, the storage capacitor portion 40, the S terminal 60, and the G terminal 70 in the active matrix substrate 1 of Embodiment 2, respectively, and show an A-A' cross section, a B-B' cross section, a C-C' cross section, and D-D' cross section in FIG. 1, respectively.

At the TFT 30, as shown in FIG. 5(a), a pixel electrode 21, a drain electrode 33, and a source electrode 32 are formed on the substrate, and a semiconductor layer 31 is formed so as to cover a portion of each of the source electrode 32 and the drain electrode 33. A source connection line 36 is formed at the opposite end of the source electrode 32 from the semiconductor layer 31.

The source connection line 36 has a three-layer structure of a first layer 51, a second layer 52, and a third layer 53 that are sequentially stacked. The first layer 51, the second layer 52, and the third layer 53 are made of e.g. MoN, Al, and MoN, respectively. The source connection line 36 may have a single-layered or multi-layered construction using any such metal(s) or any other metal(s).

A first protection layer 44 of silicon nitride is formed so as to cover the source connection line 36, and a gate insulating layer 42 is formed so as to cover the source electrode 32 not being covered by the source connection line 36, the drain electrode 33, the pixel electrode 21, the semiconductor layer 31, and the first protection layer 44. The gate insulating layer 42 is made of silicon oxide. A gate electrode 12a is formed on the gate insulating layer 42 above the channel portion of the semiconductor layer 31. The gate electrode 12a is a portion of the scanning line 12. The gate electrode 12a and the scanning line 12 have a three-layer structure of Al, Ti, and TiN, for example. On the gate insulating layer 42, a second protection layer 46 of silicon nitride is formed so as to cover the gate electrode 12a.

As shown in FIG. 5(b), the storage capacitor portion 40 is composed of the pixel electrode 21, the gate insulating layer 42 formed on the pixel electrode 21, the storage capacitor electrode 16a formed on the gate insulating layer 42, and the second protection layer 46 formed on the gate insulating layer 42 so as to cover the storage capacitor electrode 16a. The storage capacitor electrode 16a is a portion of the Cs line 16. A storage capacitor is formed by the storage capacitor electrode 16a, the pixel electrode 21, and the portion of the gate insulating layer 42 that is interposed between both electrodes.

As shown in FIG. 5(c), the S terminal 60 includes an electrode layer 61 formed on the substrate, a signal line 14 formed on the electrode layer 61, the first protection layer 44 formed so as to cover the signal line 14, and the second protection layer 46 stacked on the first protection layer 44. Above the signal line 14, a contact hole 65 which penetrates through the first protection layer 44 and the second protection layer 46 to reach the signal line 14 is formed. The electrode layer 61 is a transparent electrode layer which is made of the same material and through the same step as the pixel electrode 21. Similarly to the source connection line 36 and the like, the signal line 14 is composed of a first layer 51, a second layer 52, and a third layer 53. Via the contact hole 65, an upper connection line (not shown) formed on the second protection layer 46 is connected to the signal line 14.

As shown in FIG. 5(d), the G terminal 70 is composed of the gate insulating layer 42, the scanning line 12 formed on the gate insulating layer 42, and the second protection layer 46 formed so as to cover the scanning line 12. Above the scanning line 12, a contact hole 75 which penetrates through the second protection layer 46 to reach the signal line 12 is formed. Via the contact hole 75, an upper connection line (not shown) formed on the second protection layer 46 is connected to the scanning line 12.

In the present embodiment, the first protection layer 44 of silicon nitride is formed so as not to cover the semiconductor layer 31, and the gate insulating layer 42 of silicon oxide is formed on the semiconductor layer 31. The second protection layer 46 of silicon nitride is formed on the gate electrode 12a above the channel portion of the semiconductor layer 31. Therefore, when conducting an annealing treatment at a high temperature after the second protection layer 46 is formed, the problematic deterioration in the characteristics of the TFT 30 due to hydrogen that is contained in the silicon nitride can be prevented. Moreover, since lines such as the signal line 14 and the source connection line 36 are covered by the silicon nitride layer, line corrosion is prevented.

Next, with reference to FIGS. 6(a) to (d) and FIGS. 7(e) to (g), a method of producing the active matrix substrate 1 according to Embodiment 2 will be described. FIGS. 6(a) to (d) and FIGS. 7(e) to (g) show the construction of an A-A' cross section of the TFT 30, a B-B' cross section of the storage capacitor portion 40, a C-C' cross section of the S terminal 60, and a D-D' cross section of the G terminal 70 in FIG. 1.

Figure 6:
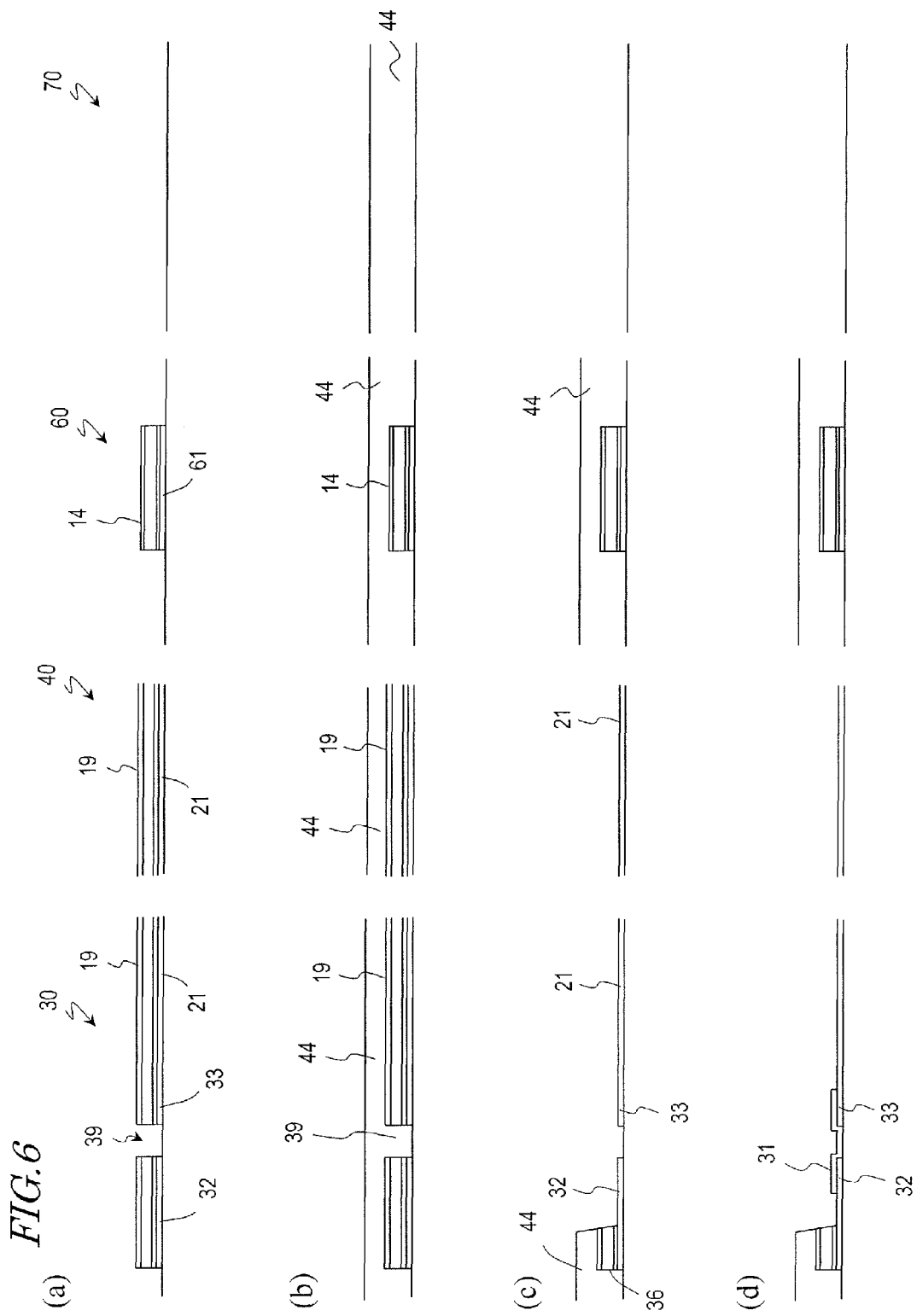
FIG. 6 (a) to (d) are cross-sectional views showing a method of producing the active matrix substrate 1 according to Embodiment 2.

Step A2:
First, ITO, MoN, Al, and MoN are sequentially stacked on a substrate by a sputtering technique or the like. Next, these four metal layers are patterned by a photolithography technique (first masking step) to obtain, as shown in FIG. 6(a), the pixel electrode 21 at the TFT 30 and the storage capacitor portion 40, the source electrode 32, the drain electrode 33, and a metal multilayer structure 19 which is stacked on these electrodes. Moreover, at the S terminal 60, an electrode layer 61 and a signal line 14 of a three-layer construction stacked on the electrode layer 61 are formed.

Step B2:
Next, silicon nitride is stacked so as to cover the above metal layers by a sputtering technique, thereby obtaining the first protection layer 44 as shown in FIG. 6(b).

Step C2:
Next, the first protection layer 44 and the metal multilayer structure 19 are selectively removed by a photolithography technique to expose, as shown in FIG. 6(c), a portion of the source electrode 32, the drain electrode 33, and the pixel electrode 21 (second masking step). At this time, the metal multilayer structure 19 remaining at the TFT 30 forms a source connection line 36. The first protection layer 44 does not remain at the G terminal 70.

Step D2:
Next, an oxide semiconductor material such as IGZO is stacked on the substrate, and patterned by a photolithography technique (third masking step) to obtain a semiconductor layer 31 as shown in FIG. 6(d).

Figure 7:
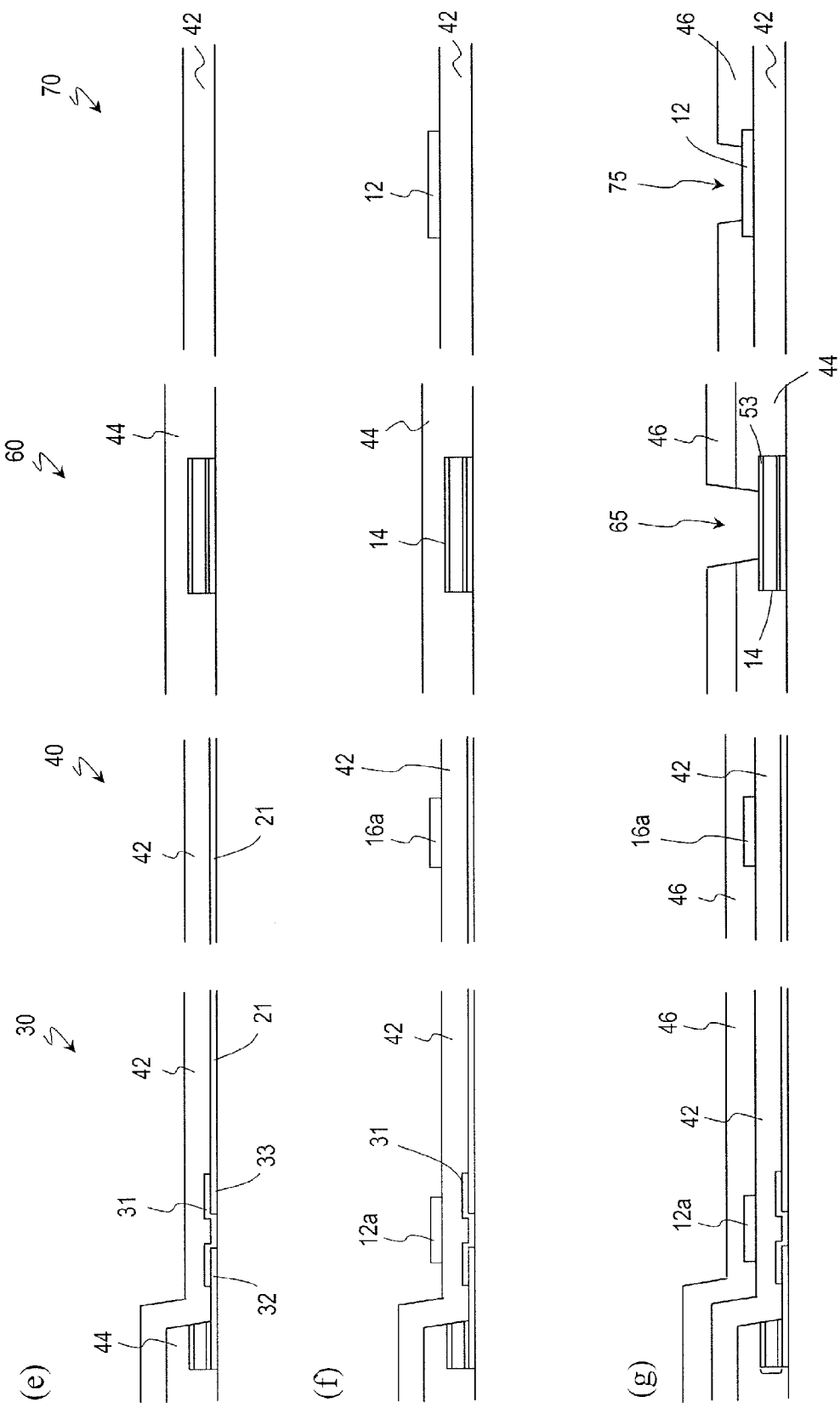
FIG. 7 (e) to (g) are cross-sectional views showing a method of producing the active matrix substrate 1 according to Embodiment 2.

Step E2:
Next, as shown in FIG. 7(e), silicon oxide is stacked on the pixel electrode 21, the source electrode 32, the drain electrode 33, the semiconductor layer 31, and the remaining first protection layer 44 to obtain the gate insulating layer 42. The gate insulating layer 42 is not stacked at the S terminal 60.

Step F2:
Next, a metal layer is stacked on the substrate by a sputtering technique. This metal layer has a three-layer construction of Al, Ti, and TiN, for example. Next, the stacked metal layer is patterned by a photolithography technique (fourth masking step) to obtain, as shown in FIG. 7(f), a gate electrode 12a, a storage capacitor electrode 16a, and a scanning line 12. At this time, a Cs line 16 not shown herein is also formed concurrently. No metal layer is left on the S terminal 60.

Step G2:
Next, by a plasma CVD technique or the like, silicon nitride is stacked so as to cover the gate electrode 12a, the storage capacitor electrode 16a, and the scanning line 12, thereby obtaining a second protection layer 46. Thereafter, the first protection layer 44 and the second protection layer 46 are patterned by a photolithography technique to form contact holes 65 and 75, respectively, above the signal line 14 at the S terminal 60 and the scanning line 12 at the G terminal 70 (fifth masking step). Herein, the third layer 53 of the signal line 14 serves as an etch stopper, such that the third layer 53 is exposed within the contact hole 65. Moreover, at the G terminal 70, the scanning line 12 is exposed within the contact hole 75.

Thus, the active matrix substrate 1 shown in FIG. 1 and FIG. 5 is accomplished. Since only five masking steps are required in the above production steps, improved production efficiency is obtained.

Embodiment 3

Next, an active matrix substrate 1 according to Embodiment 3 will be described. Hereinafter, constituent elements which are identical to those of the active matrix substrate 1 of Embodiment 1 will basically be denoted by identical reference numerals, and their description will be omitted; the differences therefrom will mainly be described. The active matrix substrate 1 of Embodiment 3 has the same planar construction as that shown in FIG. 1, and the description thereof will be omitted.

FIGS. 8(a) to (d) are cross-sectional views showing the construction of the TFT 30, the storage capacitor portion 40, the S terminal 60, and the G terminal 70 in the active matrix substrate 1 of Embodiment 3, respectively, and show an A-A' cross section, a B-B' cross section, a C-C' cross section, and D-D' cross section in FIG. 1, respectively.

Figure 8:
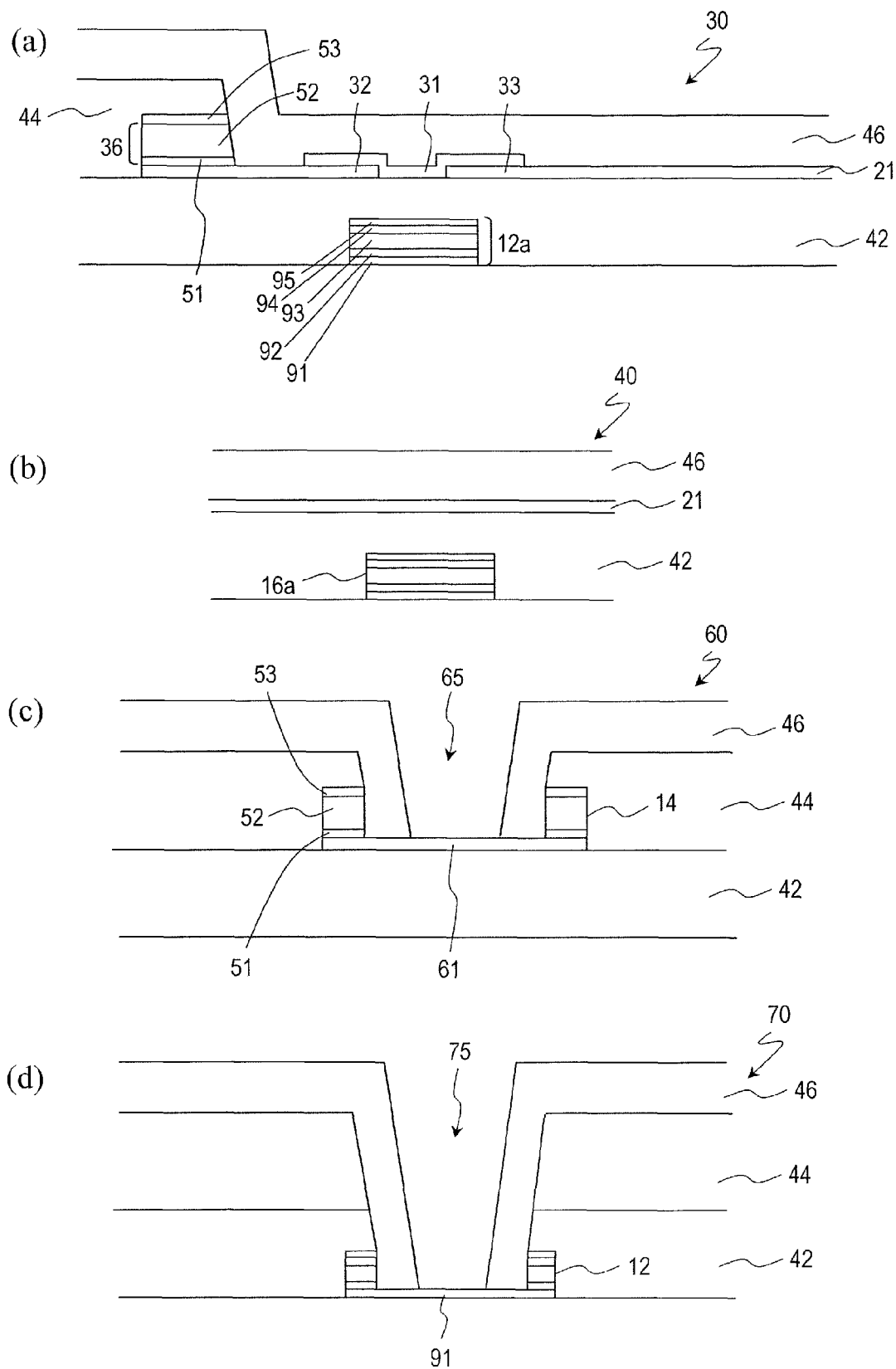
FIG. 8 (a) to (d) are cross-sectional views schematically showing the construction of a TFT 30, a storage capacitor portion 40, a signal line terminal 60, and a gate line terminal 70, respectively, of an active matrix substrate 1 according to Embodiment 3.

As shown in FIG. 8(a), the TFT 30 includes a semiconductor layer 31, a source electrode 32, a drain electrode 33, and a gate electrode 12a. The gate electrode 12a is a portion of the scanning line 12. The gate electrode 12a and the scanning line 12 have a five-layer construction of ITO, Ti, Al, Ti, and TiN that are sequentially stacked, for example. The layers of ITO, Ti, Al, Ti, and TiN will respectively be referred to as a first layer 91, a second layer 92, a third layer 93, a fourth layer 94, and a fifth layer 95.

On the gate electrode 12a, a gate insulating layer 42 of silicon oxide is formed, such that the source electrode 32, the drain electrode 33, the semiconductor layer 31, and the pixel electrode 21 are formed on the gate insulating layer 42. The semiconductor layer 31 is formed so as to cover a portion of each of the source electrode 32 and the drain electrode 33, with a channel layer of the TFT 30 being formed between both electrodes. A source connection line 36 is formed at the opposite end of the source electrode 32 from the semiconductor layer 31. The source connection line 36 has a three-layer structure of a first layer 51, a second layer 52, and a third layer 53 that are sequentially stacked. The first layer 51, the second layer 52, and the third layer 53 are made of e.g. MoN, Al, and MoN, respectively.

On the gate insulating layer 42, a first protection layer 44 of silicon nitride and a second protection layer 46 of silicon oxide are formed. While the first protection layer 44 covers the source connection line 36, the first protection layer 44 covers neither the semiconductor layer 31, the portion of the source electrode 32 where it does not overlap with the source connection line 36, the drain electrode 33, nor the pixel electrode 21. The second protection layer 46 covers the first protection layer 44, the semiconductor layer 31, the portion of the source electrode 32 where it does not overlap with the source connection line 36, the drain electrode 33, and the pixel electrode 21.

As shown in FIG. 8(b), the storage capacitor portion 40 is composed of a storage capacitor electrode 16a, the gate insulating layer 42 formed on the storage capacitor electrode 16a, the pixel electrode 21 formed on the gate insulating layer 42, and the second protection layer 46 formed on the pixel electrode 21. The storage capacitor electrode 16a is a portion of the Cs line 16. A storage capacitor is formed by the storage capacitor electrode 16a, the pixel electrode 21, and the portion of the gate insulating layer 42 that is interposed between both electrodes.

As shown in FIG. 8(c), the S terminal 60 includes the gate insulating layer 42, the electrode layer 61 and the signal line 14 disposed on the gate insulating layer 42, the first protection layer 44 stacked so as to cover the signal line 14, and the second protection layer 46 stacked on the first protection layer 44. The electrode layer 61 is a transparent electrode layer which is made of the same material and through the same step as the pixel electrode 21. The signal line 14 is formed on the electrode layer 61, and similarly to the source connection line 36 and the like, is composed of a first layer 51, a second layer 52, and a third layer 53.

Above the electrode layer 61, a contact hole 65 which penetrates through the signal line 14, the first protection layer 44, and the second protection layer 46 to reach the electrode layer 61 is formed. Side faces of the contact hole 65 are covered by the second protection layer 46. Via the contact hole 65, an upper connection line (not shown) formed on the second protection layer 46 is connected to the electrode layer 61.

As shown in FIG. 8(d), the G terminal 70 is composed of the scanning line 12, and the gate insulating layer 42, the first protection layer 44, and the second protection layer 46 sequentially formed on the scanning line 12. Above the first layer 91 of the scanning line 12, a contact hole 75 which penetrates through the other metal layers of the scanning line 12, the gate insulating layer 42, the first protection layer 44, and the second protection layer 46 to reach the first layer 91 is formed. Side faces of the contact hole 75 are covered by the second protection layer 46. Via the contact hole 75, an upper connection line (not shown) formed on the second protection layer 46 is connected to the first layer 91.

In the present embodiment, a first protection layer 44 of silicon nitride is formed on the gate insulating layer 42 without covering the semiconductor layer 31, and the second protection layer 46 of silicon oxide is formed on the semiconductor layer 31. Therefore, when conducting an annealing treatment at a high temperature after the second protection layer 46 is formed, the problematic deterioration in the characteristics of the TFT 30 due to hydrogen that is contained in the silicon nitride can be prevented. Moreover, since lines such as the signal line 14 and the source connection line 36 are covered by the silicon nitride layer, line corrosion is prevented.

Next, with reference to FIGS. 9(a) to (d) and FIGS. 10(e) to (g) a method of producing the active matrix substrate 1 according to Embodiment 3 will be described. FIGS. 9(a) to (d) and FIGS. 10(e) to (g) show the construction of an A-A' cross section of the TFT 30, a B-B' cross section of the storage capacitor portion 40, a C-C' cross section of the S terminal 60, and a D-D' cross section of the G terminal 70 in FIG. 1.

Figure 9:
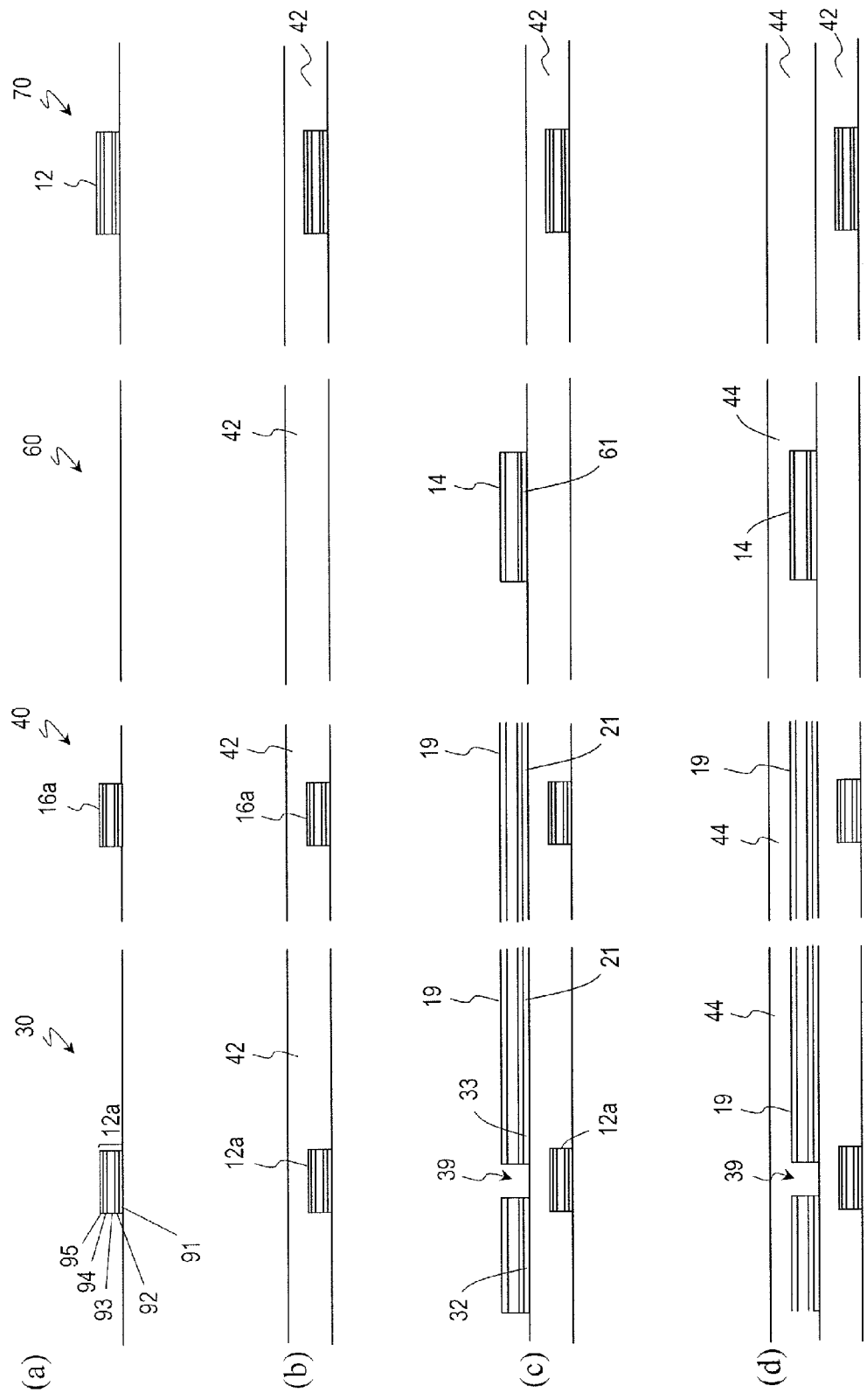
FIG. 9 (a) to (d) are cross-sectional views showing a method of producing the active matrix substrate 1 according to Embodiment 3.

Step A3:

First, by a sputtering technique or the like, a first layer 91, a second layer 92, a third layer 93, a fourth layer 94, and a fifth layer 95 are sequentially stacked on a substrate. Next, the metal layers are patterned by a photolithography technique (first masking step) to obtain, as shown in FIG. 9(a), a gate electrode 12a, a storage capacitor electrode 16a, and a scanning line 12. At this time, a Cs line 16 not shown herein is also formed concurrently. No metal layer is left on the S terminal 60.

Step B3:

Next, as shown in FIG. 9(b), silicon oxide is stacked on the substrate by a plasma CVD technique so as to cover the gate electrode 12a, the storage capacitor electrode 16a, and the scanning line 12, thereby obtaining a gate insulating layer 42.

Step C3:

Next, ITO, MoN, Al, and MoN are stacked in this order on the gate insulating layer 42. Thereafter, the stacked metal layers are patterned by a photolithography technique (second masking step) to obtain, as shown in FIG. 9(c), the pixel electrode 21 at the TFT 30 and the storage capacitor portion 40, the source electrode 32, the drain electrode 33, and the metal multilayer structure 19 of a three-layer construction stacked on these electrodes. Moreover, at the S terminal 60, an electrode layer 61 and a signal line 14 of a three-layer construction stacked on the electrode layer 61 are formed. Above the gate electrode 12a of the TFT 30, an aperture 39 in the metal multilayer structure 19 is formed at a position which later becomes a channel region of the TFT 30.

Step D3:

Next, by a plasma CVD technique, silicon nitride is stacked so as to cover the metal multilayer structure 19 and the signal line 14 to obtain a first protection layer 44 as shown in FIG. 9(d).

Figure 10:
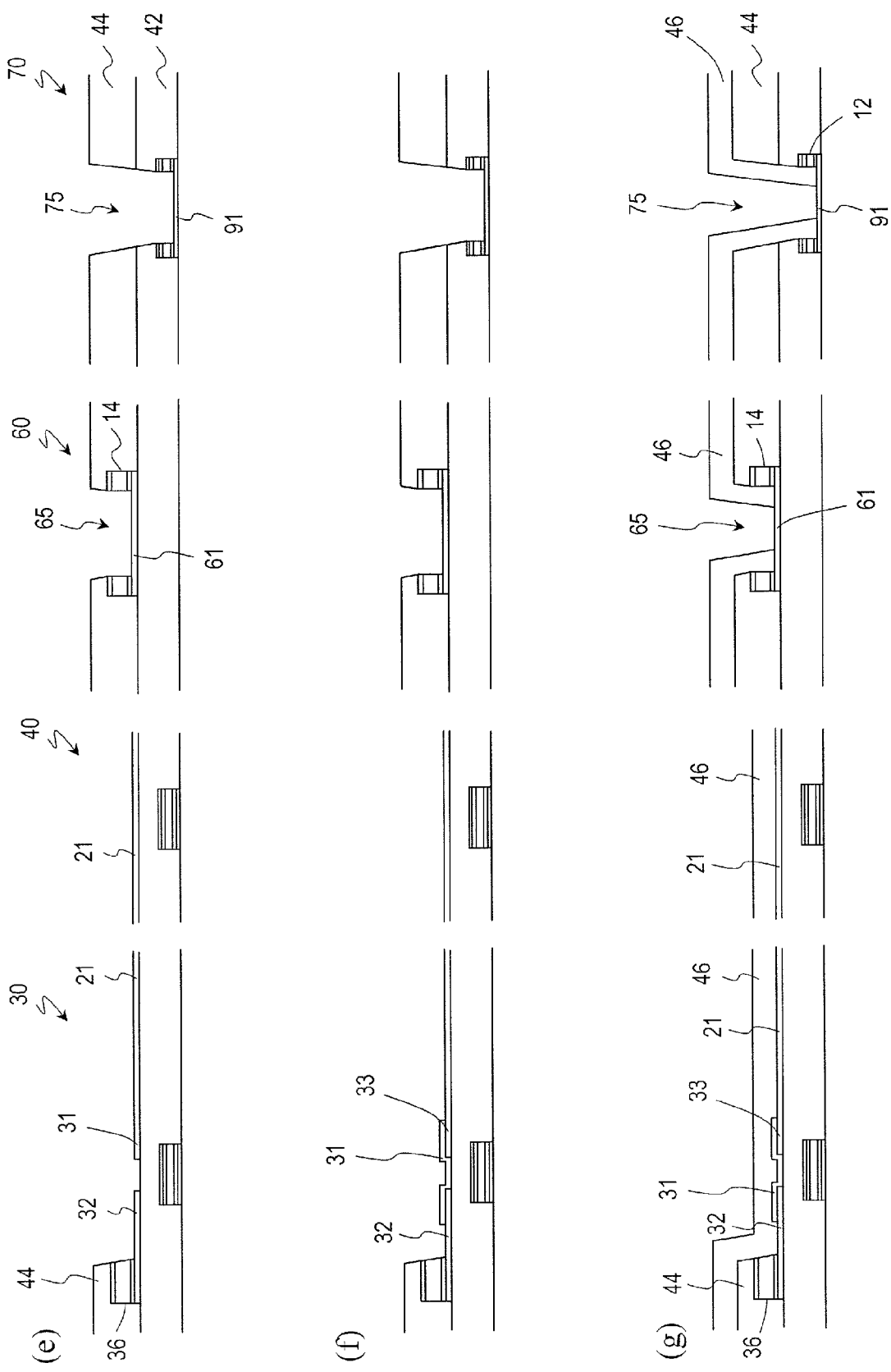
FIG. 10 (e) to (g) are cross-sectional views showing a method of producing the active matrix substrate 1 according to Embodiment 3.

Step E3:

Next, the first protection layer 44, the metal multilayer structure 19, and the signal line 14 are selectively removed by a photolithography technique to expose, as shown in FIG. 10(e), a portion of the source electrode 32, the drain electrode 33, and the pixel electrode 21 (third masking step). At this time, the remaining metal multilayer structure 19 forms the source connection line 36. At this time, at the S terminal 60, a contact hole 65 which penetrates through the first protection layer 44 and the signal line 14 is formed, within which the electrode layer 61 is exposed. At the G terminal 70, a contact hole 75 which penetrates through the first protection layer 44, the gate insulating layer 42, and the second layer to fifth layer (92 to 95) of the scanning line 12 is formed, within which the first layer 91 of the scanning line 12 is exposed.

Step F3:

Next, an oxide semiconductor material such as IGZO is stacked on the substrate, and patterned by a photolithography technique (fourth masking step) to obtain a semiconductor layer 31 as shown in FIG. 10(f).

Step G3:

Next, silicon oxide is stacked by a plasma CVD technique or the like to obtain a second protection layer 46. Thereafter, the second protection layer 46 is patterned by a photolithography technique to expose the electrode layer 61 within the contact hole 65 at the S terminal 60, and expose the first layer 91 of the scanning line 12 within the contact hole 75 at the G terminal 70 (fifth masking step).

Thus, the active matrix substrate 1 according to Embodiment 3 is accomplished. Since only five masking steps are required in the above production steps, improved production efficiency is obtained.

Embodiment 4

Next, an active matrix substrate 1 according to Embodiment 4 of the present invention will be described. Hereinafter, constituent elements which are identical to those of the active matrix substrates 1 of Embodiments 1 and 3 will basically be denoted by identical reference numerals, and their description will be omitted; the differences therefrom will mainly be described. The active matrix substrate 1 of Embodiment 4 has the same planar construction as that shown in FIG. 1, and the description thereof will be omitted.

FIGS. 11(a) to (d) are cross-sectional views showing the construction of the TFT 30, the storage capacitor portion 40, the S terminal 60, and the G terminal 70 in the active matrix substrate 1 of Embodiment 4, respectively, and show an A-A' cross section, a B-B' cross section, a C-C' cross section, and D-D' cross section in FIG. 1, respectively.

Figure 11:
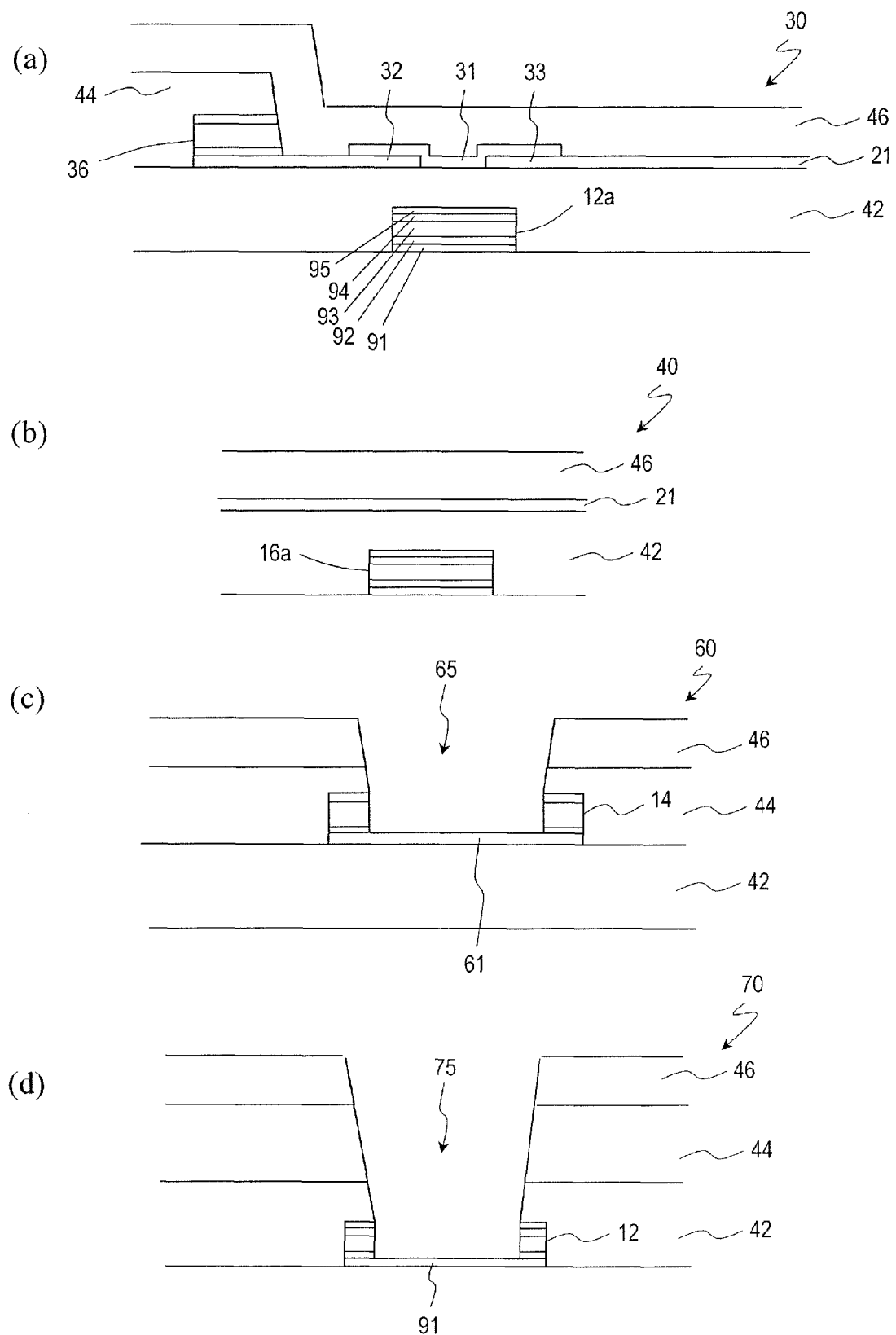
FIG. 11 (a) to (d) are cross-sectional views schematically showing the construction of a TFT 30, a storage capacitor portion 40, a signal line terminal 60, and a gate line terminal 70, respectively, of an active matrix substrate 1 according to Embodiment 4.

The construction of the TFT 30 and the storage capacitor portion 40 is the same as in Embodiment 3, as is shown in FIGS. 11(a) and (b), and the description thereof will be omitted.

As shown in FIG. 11(c), the S terminal 60 includes the gate insulating layer 42, the electrode layer 61 and the signal line 14 disposed on the gate insulating layer 42, the first protection layer 44 stacked so as to cover the signal line 14, and the second protection layer 46 stacked on the first protection layer 44.

Above the electrode layer 61, a contact hole 65 which penetrates through the signal line 14, the first protection layer 44, and the second protection layer 46 to reach the electrode layer 61 is formed. Via the contact hole 65, an upper connection line (not shown) formed on the second protection layer 46 is connected to the electrode layer 61.

As shown in FIG. 11(d), the G terminal 70 is composed of the scanning line 12, and the gate insulating layer 42, the first protection layer 44, and the second protection layer 46 sequentially formed on the scanning line 12. Above the first layer 91 of the scanning line 12, a contact hole 75 which penetrates through the second layer to fifth layer (92 to 95) of the scanning line 12, the gate insulating layer 42, the first protection layer 44, and the second protection layer 46 to reach the first layer 91 is formed. Via the contact hole 75, an upper connection line (not shown) formed on the second protection layer 46 is connected to the first layer 91.

In the present embodiment, a first protection layer 44 of silicon nitride is formed on the gate insulating layer 42 without covering the semiconductor layer 31, and the second protection layer 46 of silicon oxide is formed on the semiconductor layer 31. Therefore, when conducting an annealing treatment at a high temperature after the second protection layer 46 is formed, the problematic deterioration in the characteristics of the TFT 30 due to hydrogen that is contained in the silicon nitride can be prevented. Moreover, since lines such as the signal line 14 and the source connection line 36 are covered by the silicon nitride layer, line corrosion is prevented.

Figure 12:
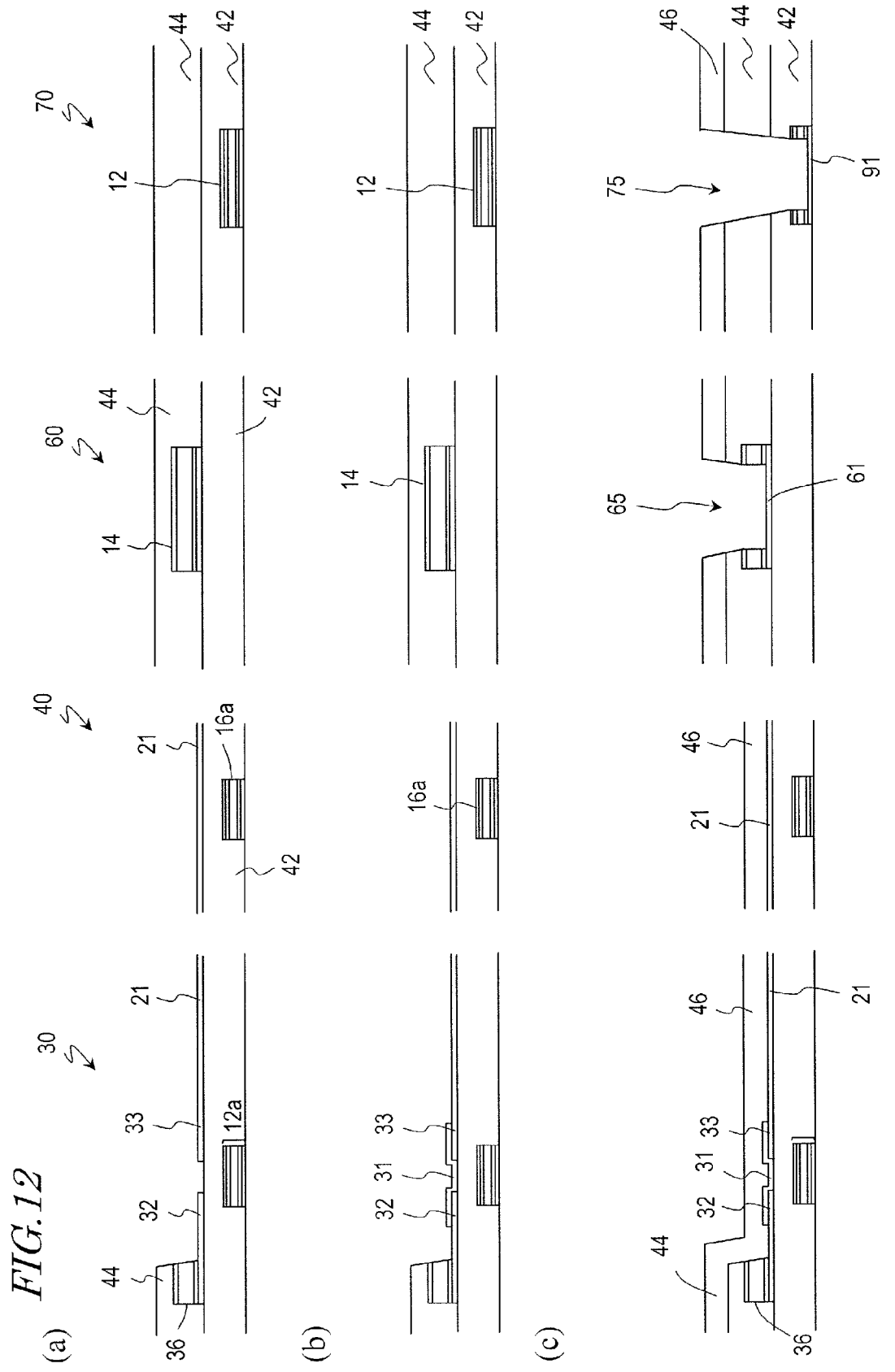
FIG. 12 (a) to (c) are cross-sectional views showing a method of producing the active matrix substrate 1 according to Embodiment 4.

Next, with reference to FIGS. 12(a) to (c), a method of producing the active matrix substrate 1 according to Embodiment 4 will be described. FIGS. 12(a) to (c) show the construction of an A-A' cross section of the TFT 30, a B-B' cross section of the storage capacitor portion 40, a C-C' cross section of the S terminal 60, and a D-D' cross section of the G terminal 70 in FIG. 1.

Step A4:

First, after conducting steps A3 to D3 described in Embodiment 3, the first protection layer 44 and the metal multilayer structure 19 are selectively removed by a photolithography technique to expose, as shown in FIG. 12(a), a portion of the source electrode 32, the drain electrode 33, and the pixel electrode 21 (third masking step). At this time, the remaining metal multilayer structure 19 forms the source connection line 36. At this time, the first protection layer 44 is not removed at the S terminal 60 and the G terminal 70.

Step B4:

Next, an oxide semiconductor material such as IGZO is stacked on the substrate, and patterned by a photolithography technique (fourth masking step) to obtain a semiconductor layer 31 as shown in FIG. 12(b).

Step C4:

Next, silicon oxide is stacked by a plasma CVD technique or the like to obtain a second protection layer 46. Thereafter, the second protection layer 46 is patterned by a photolithography technique to form a contact hole 65 at the S terminal 60 and a contact hole 75 at the G terminal 70 (fifth masking step).

Thus, the active matrix substrate 1 according to Embodiment 4 is accomplished. Since only five masking steps are required in the above production steps, improved production efficiency is obtained.

Embodiment 5

Next, an active matrix substrate 1 according to Embodiment 5 of the present invention will be described. Hereinafter, constituent elements which are identical to those of the active matrix substrates 1 of Embodiments 1 and 2 will basically be denoted by identical reference numerals, and their description will be omitted; the differences therefrom will mainly be described. The active matrix substrate 1 of Embodiment 5 has the same planar construction as that shown in FIG. 1, and the description thereof will be omitted.

FIGS. 13(a) to (d) are cross-sectional views showing the construction of the TFT 30, the storage capacitor portion 40, the S terminal 60, and the G terminal 70 in the active matrix substrate 1 of Embodiment 5, respectively, and show an A-A' cross section, a B-B' cross section, a C-C' cross section, and D-D' cross section in FIG. 1, respectively.

Figure 13:
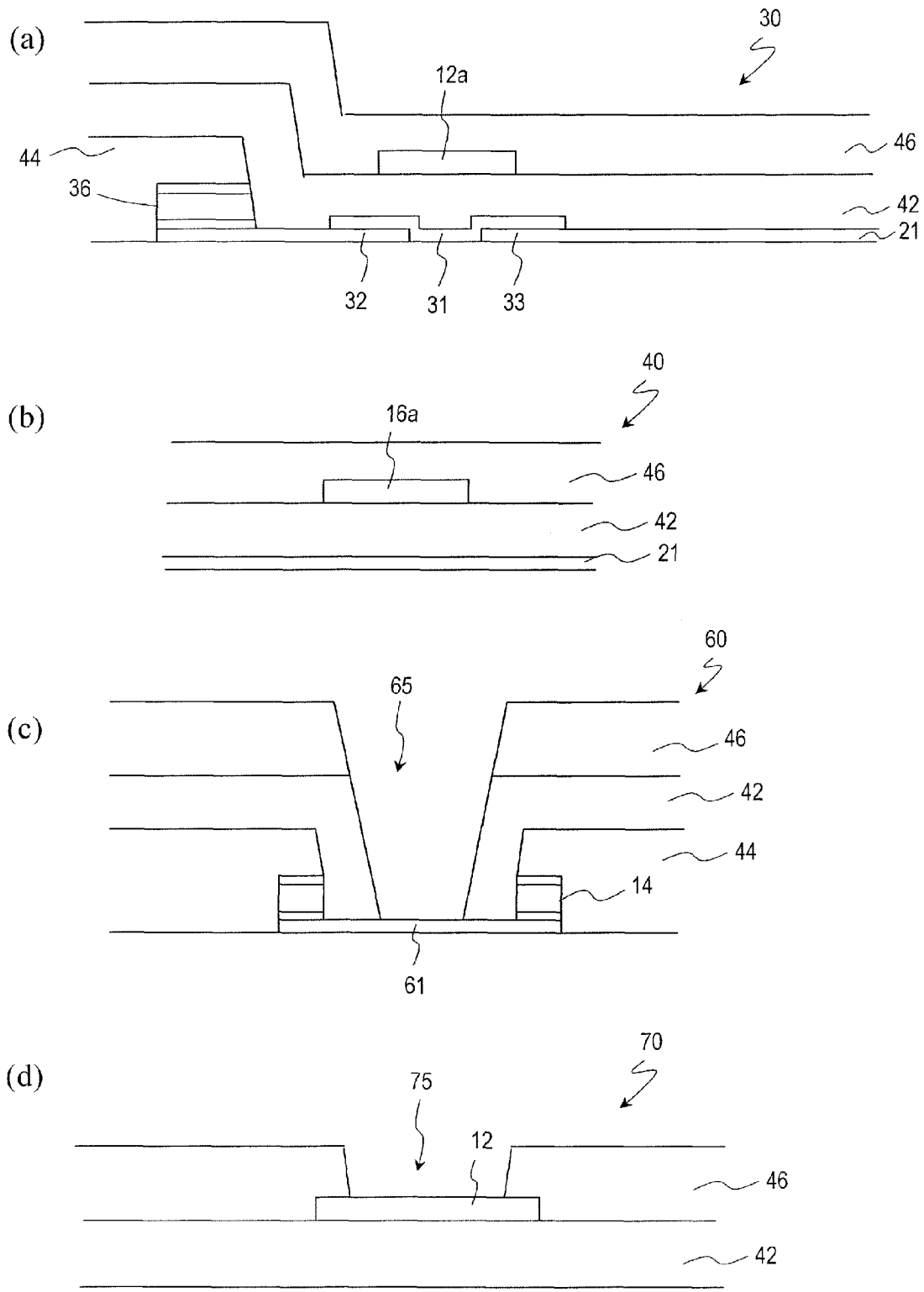
FIG. 13 (a) to (d) are cross-sectional views schematically showing the construction of a TFT 30, a storage capacitor portion 40, a signal line terminal 60, and a gate line terminal 70, respectively, of an active matrix substrate 1 according to Embodiment 5.

The construction of the TFT 30, the storage capacitor portion 40, and the G terminal 70 is the same as in Embodiment 2, as is shown in FIGS. 13(a), (b), and (d), and the description thereof will be omitted.

As shown in FIG. 13(c), the S terminal 60 is composed of an electrode layer 61 formed on a substrate, a signal line 14 formed on the electrode layer 61, a first protection layer 44 formed on the signal line 14, a gate insulating layer 42 stacked on the first protection layer 44, and a second protection layer 46 stacked on the gate insulating layer 42. Above the electrode layer 61, a contact hole 65 which penetrates through the signal line 14, the first protection layer 44, the gate insulating layer 42, and the second protection layer 46 is formed. Side faces of the contact hole 65 are covered by the second protection layer 46. Via the contact hole 65, an upper connection line (not shown) formed on the second protection layer 46 is connected to the electrode layer 61.

In the present embodiment, the first protection layer 44 of silicon nitride is formed so as not to cover the semiconductor layer 31, and the gate insulating layer 42 of silicon oxide is formed on the semiconductor layer 31. The second protection layer 46 of silicon nitride is formed on the gate electrode 12a above the channel portion of the semiconductor layer 31. Therefore, when conducting an annealing treatment at a high temperature after the second protection layer 46 is formed, the problematic deterioration in the characteristics of the TFT 30 due to hydrogen that is contained in the silicon nitride can be prevented. Moreover, since lines such as the signal line 14 and the source connection line 36 are covered by the silicon nitride layer, line corrosion is prevented.

Next, with reference to FIGS. 14(a) to (d) and FIGS. 15(e) to (g), a method of producing the active matrix substrate 1 according to Embodiment 5 will be described. FIGS. 14(a) to (d) and FIGS. 15(e) to (g) show the construction of an A-A' cross section of the TFT 30, a B-B' cross section of the storage capacitor portion 40, a C-C' cross section of the S terminal 60, and a D-D' cross section of the G terminal 70 in FIG. 1.

Figure 14:
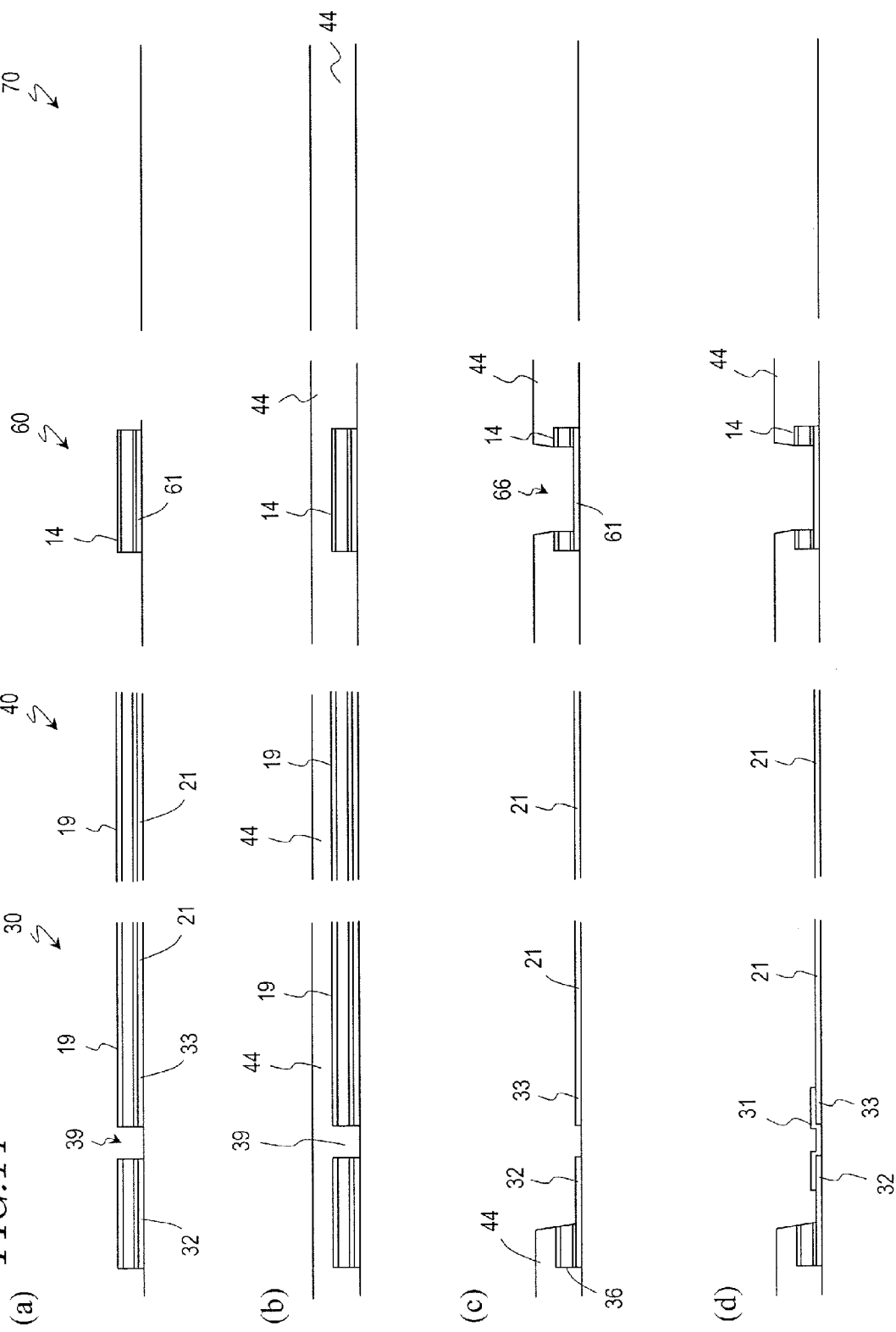
FIG. 14 (a) to (d) are cross-sectional views showing a method of producing the active matrix substrate 1 according to Embodiment 5.

Step A5:
The same step as step A2 described in Embodiment 2 is performed to obtain, as shown in FIG. 14(a), the pixel electrode 21 at the TFT 30 and the storage capacitor portion 40, the source electrode 32, the drain electrode 33, and a metal multilayer structure 19 which is stacked on these electrodes. Moreover, at the S terminal 60, an electrode layer 61 and a signal line 14 of a three-layer construction stacked on the electrode layer 61 are formed.

Step B5:
The same step as step B2 described in Embodiment 2 is performed to form a first protection layer 44 as shown in FIG. 14(b).

Step C5:
Next, the first protection layer 44, the metal multilayer structure 19, and the signal line 14 are selectively removed by a photolithography technique to expose, as shown in FIG. 14(c), a portion of the source electrode 32, the drain electrode 33, and the pixel electrode 21 (second masking step). At this time, the metal multilayer structure 19 remaining at the TFT 30 forms a source connection line 36. At the S terminal 60, an aperture in the signal line 14 and the first protection layer 44 is formed above the electrode layer 61, within which the electrode layer 61 is exposed. The first protection layer 44 does not remain at the G terminal 70.

Step D5:
Next, an oxide semiconductor material is stacked on the substrate, and patterned by a photolithography technique (third masking step) to obtain a semiconductor layer 31 as shown in FIG. 14(d).

Figure 15:
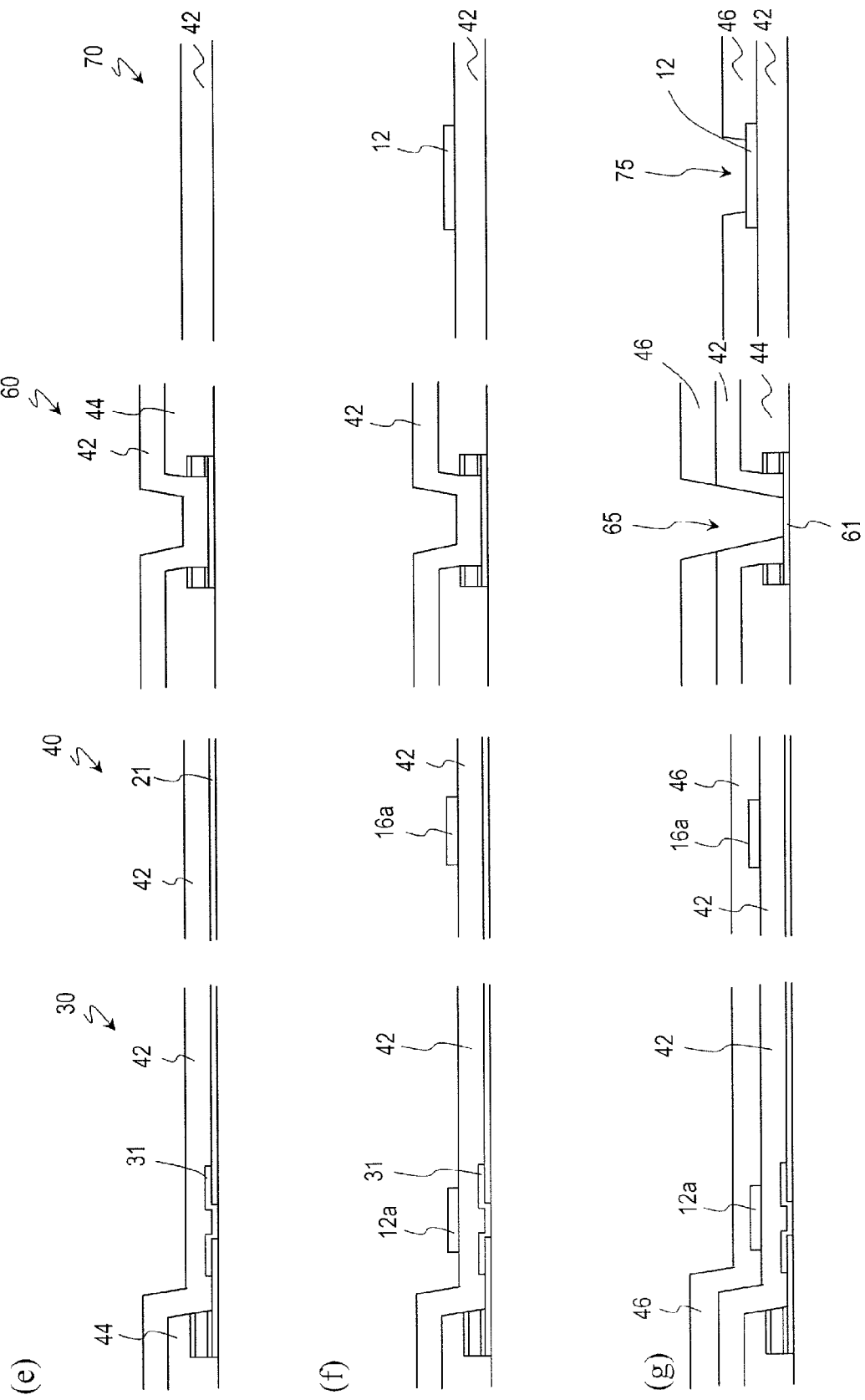
FIG. 15 (e) to (g) are cross-sectional views showing a method of producing the active matrix substrate 1 according to Embodiment 5.

Step E5:
Next, as shown in FIG. 15(e), silicon oxide is stacked on the substrate to obtain a gate insulating layer 42.

Step F5:
Next, a metal layer is stacked on the substrate by a sputtering technique. This metal layer has a three-layer construction of Al, Ti, and TiN, for example. Next, the stacked metal layer is patterned by a photolithography technique (fourth masking step) to obtain, as shown in FIG. 15(f), a gate electrode 12a, a storage capacitor electrode 16a, and a scanning line 12. At this time, a Cs line 16 not shown herein is also formed concurrently. No metal layer is left on the S terminal 60.

Step G5:
Next, by a plasma CVD technique or the like, silicon nitride is stacked so as to cover the gate electrode 12a, the storage capacitor electrode 16a, and the scanning line 12, thereby obtaining a second protection layer 46. Thereafter, the second protection layer 46 is patterned by a photolithography technique to form contact holes 65 and 75 above the electrode layer 61 at the S terminal 60 and the scanning line 12 at the G terminal 70, respectively (fifth masking step). The electrode layer 61 is exposed within the contact hole 65, and the scanning line 12 is exposed within the contact hole 75.

Thus, the active matrix substrate 1 according to Embodiment 5 is accomplished. Since only five masking steps are required in the above production steps, improved production efficiency is obtained.

Embodiment 6

Figure 16:
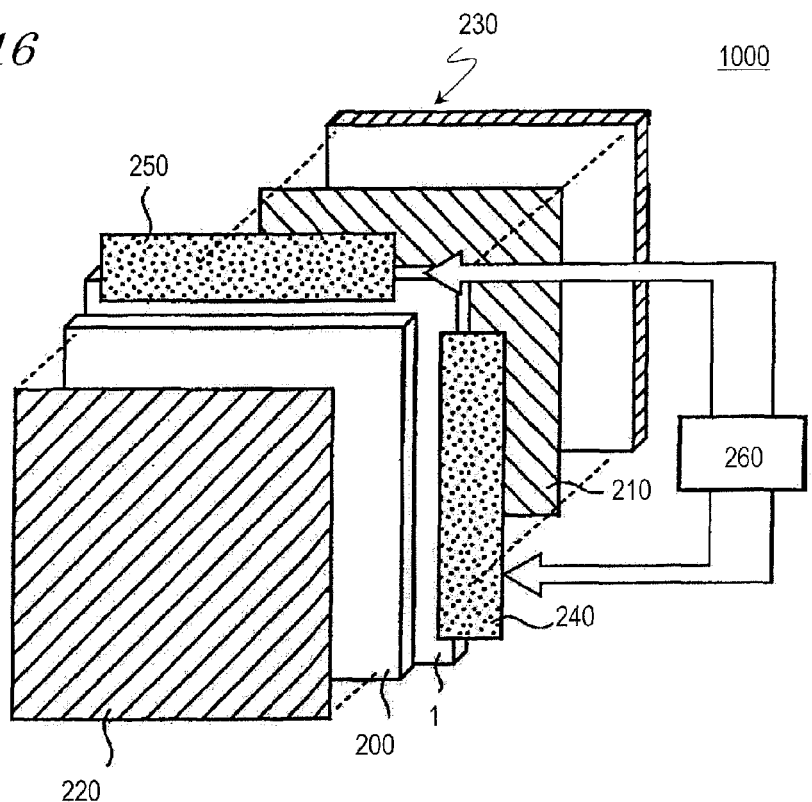
FIG. 16 A perspective view schematically showing the construction of a liquid crystal display device 1000 according to the present invention.

FIG. 16 is a perspective view schematically showing the construction of a liquid crystal display device 1000 according to Embodiment 6 of the present invention.

As shown in FIG. 16, the liquid crystal display device 1000 includes: an active matrix substrate (TFT substrate) 1 and a counter substrate 200, which oppose each other with a liquid crystal layer interposed therebetween; polarizers 210 and 220 provided respectively outside the active matrix substrate 1 and the counter substrate 200; and a backlight unit 230 which emits light for displaying toward the active matrix substrate 1. As the active matrix substrate 1, the active matrix substrates 1 of Embodiments 1 to 5 can be used. On the active matrix substrate 1, a scanning line driving circuit 240 for driving a plurality of scanning lines and a signal line driving circuit 250 for driving a plurality of signal lines are disposed. The scanning line driving circuit 240 and the signal line driving circuit 250 are connected to a control circuit 260 which is internal or external to the active matrix substrate 1. Under control of the control circuit 260, scanning signals for switching the TFTs ON/OFF are supplied from the scanning line driving circuit 240 to the plurality of scanning lines, and display signals (applied voltages to the pixel electrodes) are supplied from the signal line driving circuit 250 to the plurality of signal lines.

The counter substrate 200 includes color filters and a common electrode. In the case of displaying in three primary colors, the color filters include an R (red) filter, a G (green) filter, and a B (blue) filter each provided corresponding to a pixel. The common electrode is formed so as to cover the plurality of pixel electrodes, with the liquid crystal layer interposed therebetween. In accordance with a potential difference applied between the common electrode and each pixel electrode, the liquid crystal molecules between the electrodes become aligned for the respective pixel, whereby displaying is performed.

Figure 17:
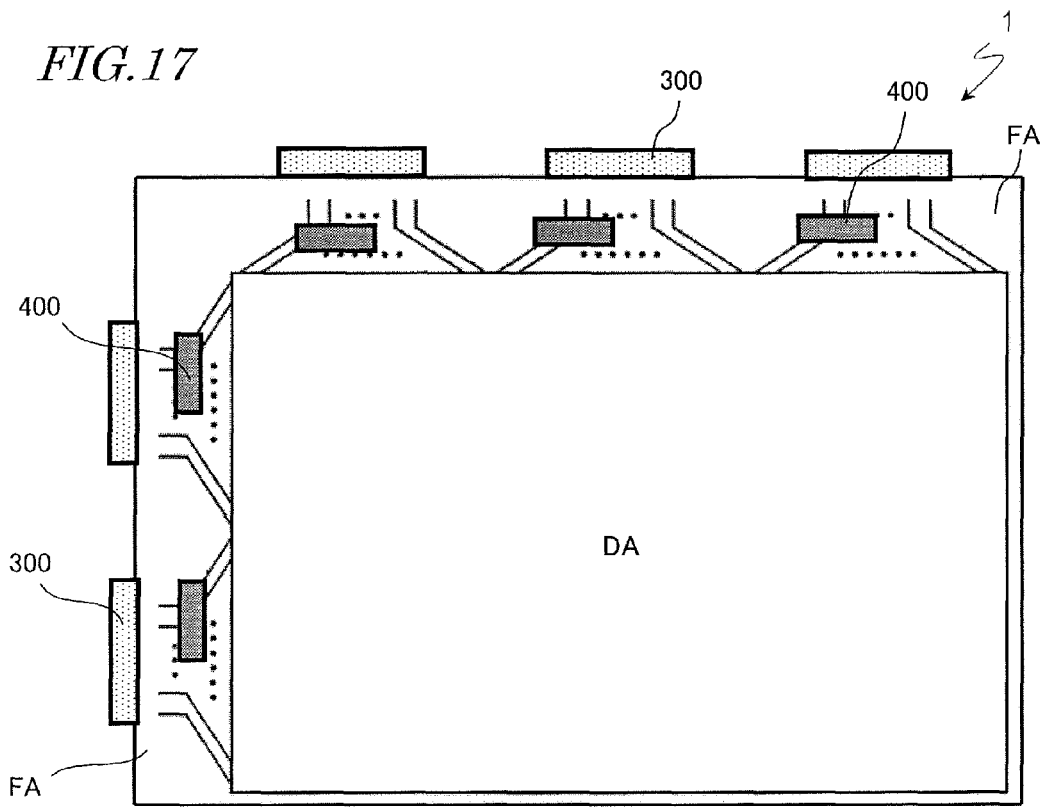
FIG. 17 A plan view schematically showing the construction of an active matrix substrate 1 of the liquid crystal display device 1000.
Figure 18:
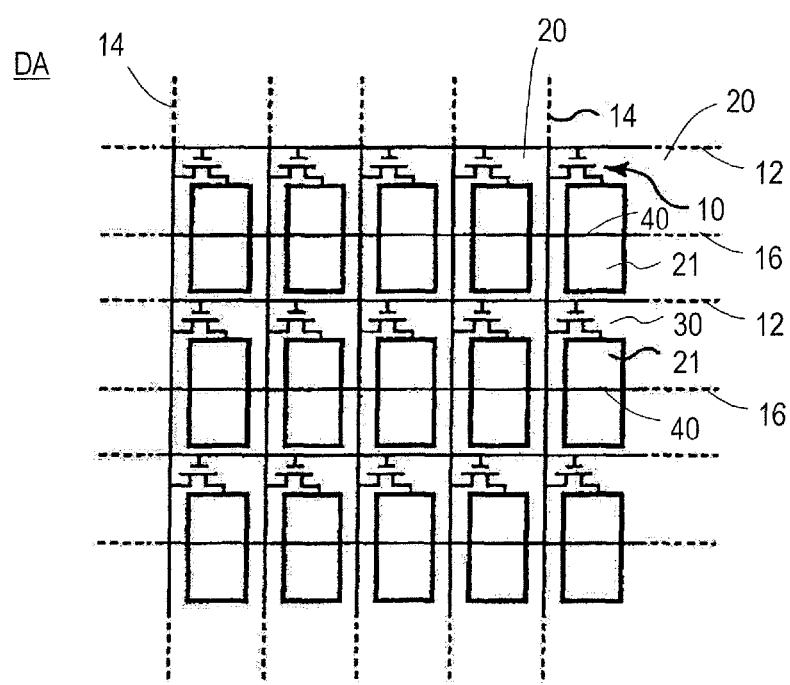
FIG. 18 A plan view schematically showing the construction of a displaying region DA of the active matrix substrate 1.
Figure 19:
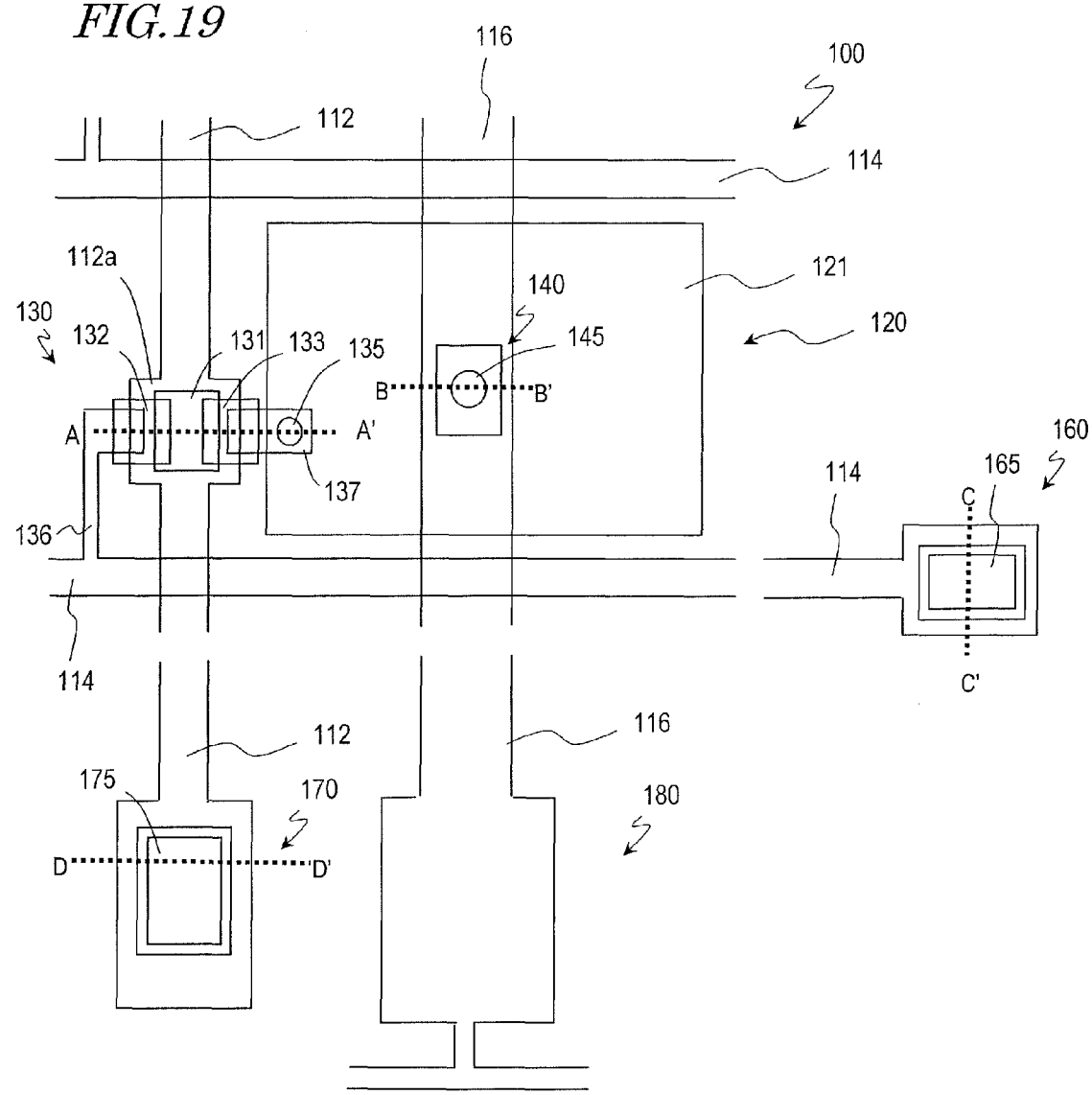
FIG. 19 A plan view schematically showing the construction of active matrix substrates 100 according to a first reference example and a second reference example.
Figure 20:
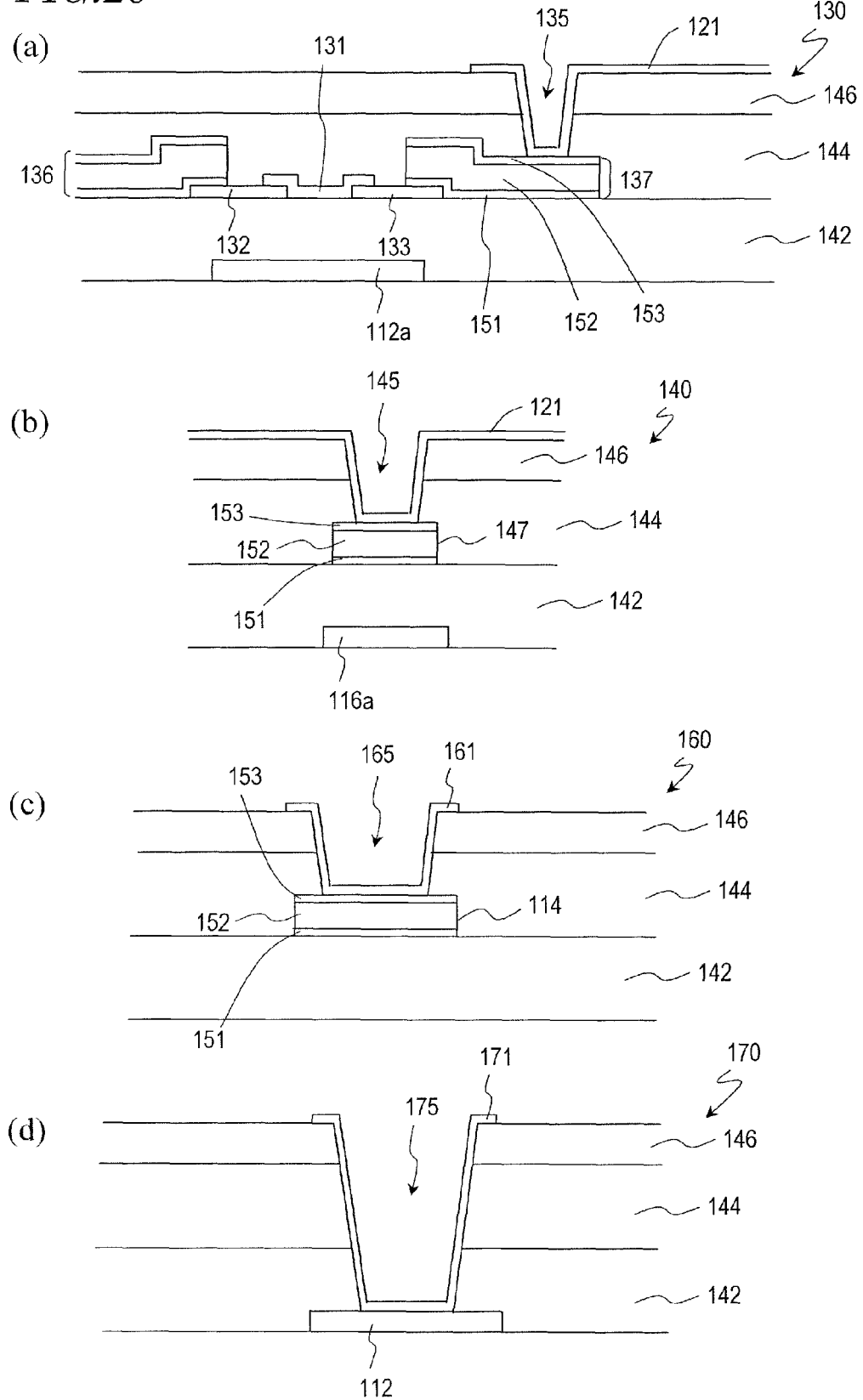
FIG. 20 (a) to (d) are cross-sectional views schematically showing the construction of a TFT 130, a storage capacitor portion 140, an S terminal 160, and a G terminal 170 of the active matrix substrate 100 according to the first reference example.
Figure 21:
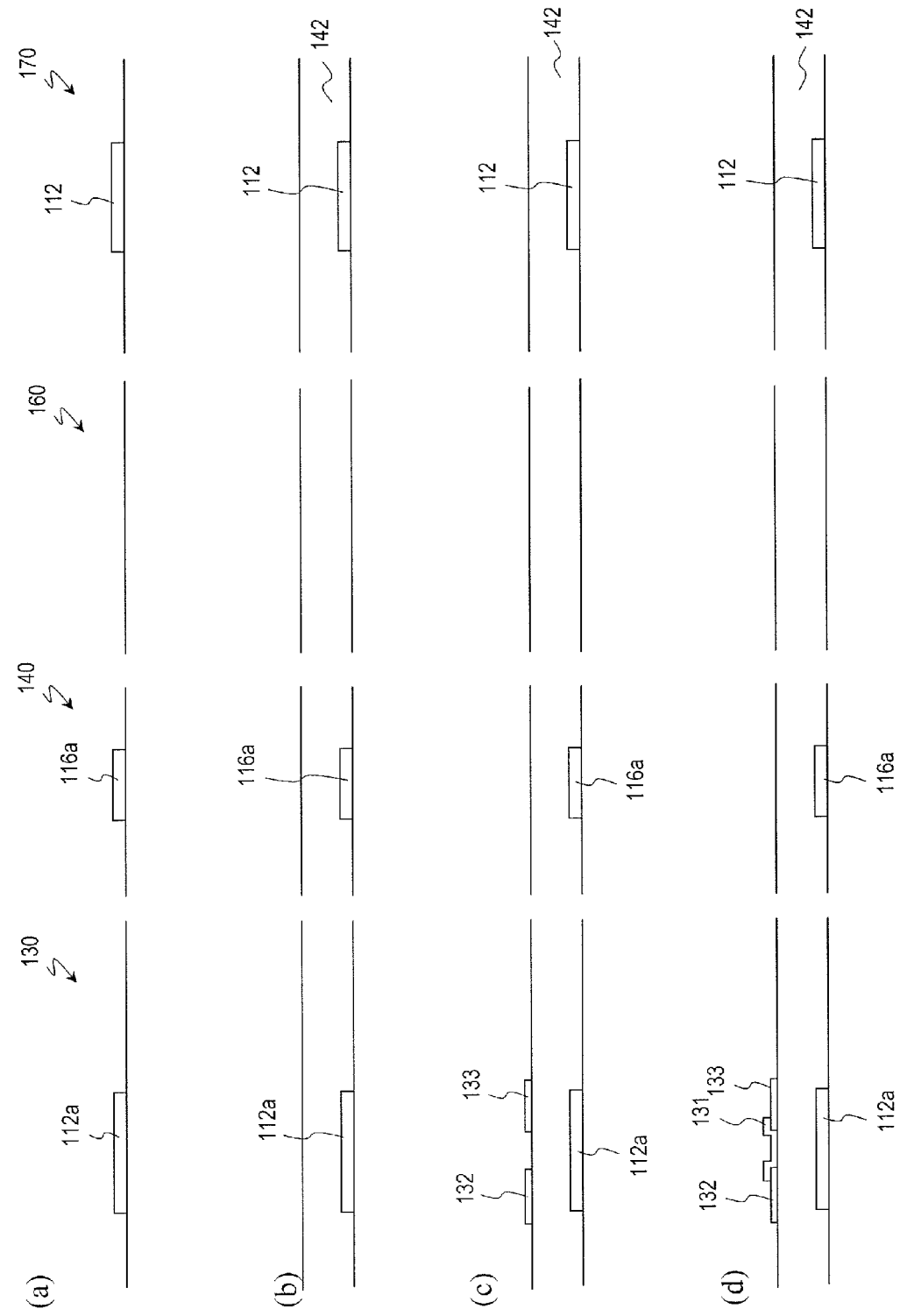
FIG. 21 (a) to (d) are cross-sectional views schematically showing a method of producing the active matrix substrate 100 according to the first reference example.
Figure 22:
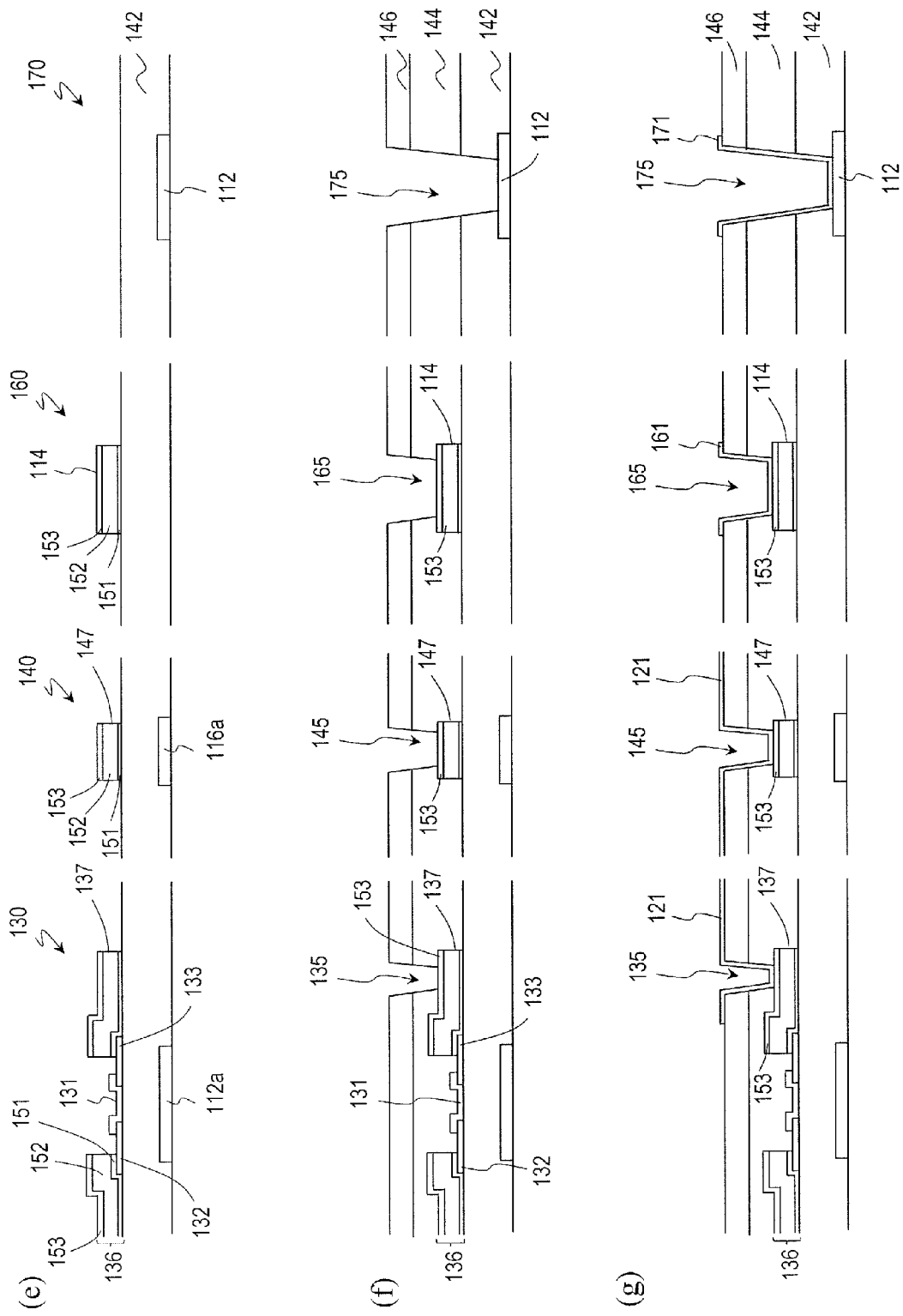
FIG. 22 (e) to (g) are cross-sectional views schematically showing a method of producing the active matrix substrate 100 according to the first reference example.
Figure 24:
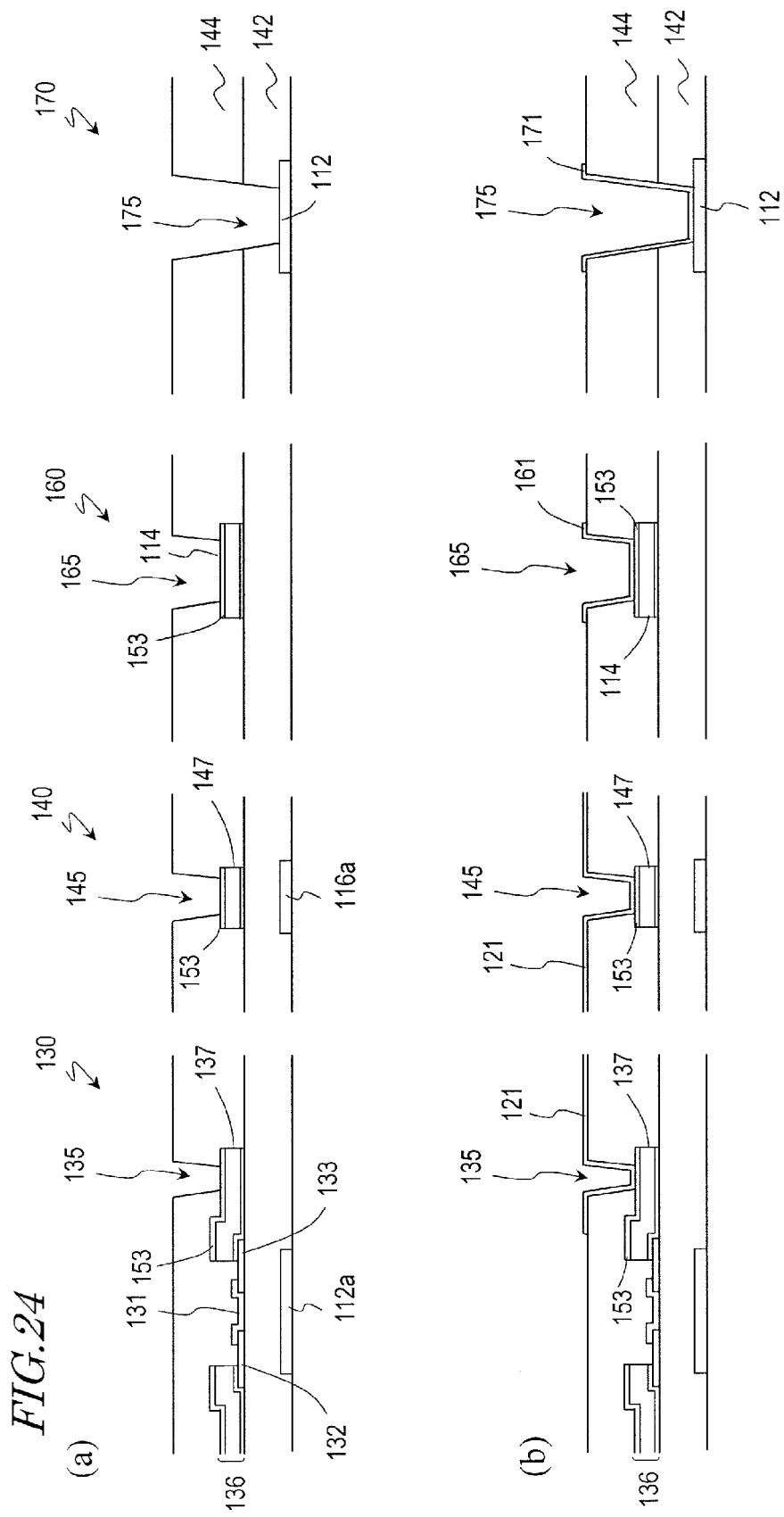
FIGS. 24 (a) and (b) are cross-sectional views schematically showing a method of producing the active matrix substrate 100 according to the second reference example.

FIG. 17 is a plan view schematically showing the construction of the active matrix substrate 1, and FIG. 18 is a plan view schematically showing the construction of a displaying region DA of the active matrix substrate 1.

As shown in FIG. 17, the active matrix substrate 1 has a display section DA a peripheral section FA located outside the display section DA. In the peripheral section FA, electrical elements such as the scanning line driving circuit 240, the signal line driving circuit 250, and voltage supply circuits are disposed in COG (Chip on Glass) fashion. The electrical elements such as TFTs or diodes in the peripheral section FA may be formed through the same production steps as the TFTs in the display section DA. Moreover, terminals 300 are provided near outer ends of the peripheral section FA for attaching external devices, e.g., FPCs (Flexible Printed Circuits). Furthermore, terminals 400 for electrically connecting upper connection lines and lower connection lines are formed in the peripheral section FA. The terminals 400 may include the S terminal 60, the G terminal 70, and the Cs terminal 80 shown in FIG. 1.

As shown in FIG. 18, a plurality of pixels 20 are provided in a matrix shape in the display section DA, and plurality of scanning lines 12 and a plurality of signal lines 14 are disposed orthogonal to one another. Near each of the intersections between the plurality of scanning lines 12 and the plurality of signal lines 14, a TFT 30 is formed for each pixel 20. A portion of a scanning line 12 constitutes the gate electrode of a TFT 30. In each pixel 20, a pixel electrode 21, for example, which is electrically connected to a drain electrode of the TFT 30 is disposed. Moreover, between any two adjacent scanning lines 12, a Cs line 16 extends in parallel to the scanning lines 12. A Cs portion 40 is formed in each pixel 20.

INDUSTRIAL APPLICABILITY

The present invention is suitably used for an active matrix substrate having an oxide semiconductor TFT, and a display device, e.g., a liquid crystal display device or an organic EL display device, having such an active matrix substrate.

REFERENCE SIGNS LIST 1, 100 active matrix substrate
12, 112 scanning line
12a, 112a gate electrode
14, 114 signal line
16, 116 storage capacitor line (Cs line)
16a, 116a storage capacitor electrode
19 metal multilayer structure
20, 120 pixel
21, 121 pixel electrode
30, 130 TFT
31, 131 semiconductor layer
32, 132 source electrode
33, 133 drain electrode
36, 136 source connection line
40, 140 storage capacitor portion
42, 142 gate insulating layer
44, 144 first protection layer
46, 146 second protection layer
51 first layer
52 second layer
53 third layer
54 fourth layer
60, 160 signal line terminal (S terminal)
61 electrode layer
65, 75, 135, 145, 165, 175 contact hole
39, 66 aperture
70, 170 gate line terminal (G terminal)
80, 180 storage capacitor line terminal (Cs terminal)
137 drain connection line
147 Cs counter electrode
151 lower layer
152 intermediate layer
153 upper layer
161, 171 upper connection line
200 counter substrate
210, 220 polarizer
230 backlight unit
240 scanning line driving circuit
250 signal line driving circuit
260 control circuit
300, 400 terminal
1000 liquid crystal display device

The invention claimed is:

1. An active matrix substrate including a thin film transistor, the thin film transistor having an oxide semiconductor, comprising:
   a gate electrode, a source electrode, and a drain electrode of the thin film transistor;
   a plurality of pixels each including a pixel electrode, the pixel electrode being connected to the drain electrode;
   a signal line that supplies a voltage to the source electrode;
   a scanning line that supplies a switching signal for the thin film transistor; and
   a semiconductor layer connected to the source electrode and the drain electrode, the semiconductor layer being made of an oxide semiconductor, and
   a source connection line that interconnects the signal line and the source electrode, wherein,
      a first protection layer of silicon nitride is provided without covering the semiconductor layer,
      a gate insulating layer of silicon oxide being provided on the semiconductor layer,
      the gate electrode being provided on the gate insulating layer above a channel portion of the semiconductor layer, and
      a second protection layer of silicon nitride being provided on the gate electrode; and
   the signal line and the source connection line are in contact with the first protection layer,
   the signal line comprises a metal stack and is provided on an electrode layer of a transparent electrode material;
   the source electrode, the drain electrode, and the pixel electrode is made of the transparent electrode material at a same level,
   the source connection line comprises a portion of the metal stack and is provided on a portion of the source electrode; and
   side surfaces of the source connection line and the source electrode are at least partially aligned with each other.

2. The active matrix substrate of claim 1 comprising a storage capacitor formed in each of the plurality of pixels, wherein
   a storage capacitor electrode of the storage capacitor is disposed so as to oppose the pixel electrode with the gate insulating layer interposed therebetween.

3. The active matrix substrate of claim 1 comprising a signal line terminal, the signal line terminal including a portion of the signal line, wherein
   a contact hole penetrating through the first protection layer and the second protection layer and reaching the signal line is provided in the signal line terminal.

4. The active matrix substrate of claim 1 comprising a gate line terminal, the gate line terminal including a portion of the scanning line, wherein
   a contact hole penetrating at least through the second protection layer and reaching the scanning line is provided in the gate line terminal.

5. A display device comprising the active matrix substrate of claim 1.

6. The active matrix substrate of claim 1, wherein the semiconductor layer includes InGaZnOx.

7. An active matrix substrate including a thin film transistor, the thin film transistor having an oxide semiconductor, comprising:
   a gate electrode, a source electrode, and a drain electrode of the thin film transistor;
   a plurality of pixels each including a pixel electrode, the pixel electrode being connected to the drain electrode;
   a signal line that supplies a voltage to the source electrode;
   a scanning line that supplies a switching signal for the thin film transistor; and
   a semiconductor layer connected to the source electrode and the drain electrode, the semiconductor layer being made of an oxide semiconductor, wherein,
   a gate insulating layer of silicon oxide is provided on the gate electrode,
   the source electrode, the drain electrode, and the semiconductor layer being provided on the gate insulating layer,
   a first protection layer of silicon nitride being provided on the gate insulating layer without covering the semiconductor layer,
   a second protection layer of silicon oxide being provided on the semiconductor layer, the signal line comprises a metal stack and is provided on an electrode layer of a transparent electrode material,
   the source electrode, the drain electrode, and the pixel electrode is made of the transparent electrode material at a same level, and
   the source connection line comprises a portion of the metal stack and is provided on a portion of the source electrode.

8. An active matrix substrate including a thin film transistor, the thin film transistor having an oxide semiconductor, comprising:
   a gate electrode, a source electrode, and a drain electrode of the thin film transistor;
   a plurality of pixels each including a pixel electrode, the pixel electrode being connected to the drain electrode;
   a signal line that supplies a voltage to the source electrode;
   a scanning line that supplies a switching signal for the thin film transistor; and
   a semiconductor layer connected to the source electrode and the drain electrode, the semiconductor layer being made of an oxide semiconductor;
   a source connection line that interconnects the signal line and the source electrode; wherein
   a first protection layer of silicon nitride is provided without covering the semiconductor layer, and as viewed along a normal to the active matrix substrate, the first protection layer does not overlap with the semiconductor layer;
   a gate insulating layer of silicon oxide being provided on the semiconductor layer, the source electrode, and the first protection layer;
   the gate electrode being provided on the gate insulating layer above a channel portion of the semiconductor layer;
   a second protection layer of silicon nitride being provided on the gate electrode;
   the source connection line is provided on a portion of the source electrode;
   the first protection layer is in contact with an upper surface of the source connection line;
   the gate insulating layer is in contact with a portion of a side surface of the source connecting line and at least a portion of the source electrode;
   the signal line comprises a metal stack and is provided on an electrode layer of a transparent electrode material;
   the source electrode, the drain electrode, and the pixel electrode is made of the transparent electrode material at a same level,
   the source connection line comprises a portion of the metal stack and is provided on a portion of the source electrode.

* * * * *